US007054195B2

(12) United States Patent
Matsunaga

(10) Patent No.: US 7,054,195 B2
(45) Date of Patent: May 30, 2006

(54) NONVOLATILE SEMICONDUCTOR MEMORY

(75) Inventor: Yasuhiko Matsunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 10/887,821

(22) Filed: Jul. 12, 2004

(65) Prior Publication Data

US 2005/0105359 A1    May 19, 2005

(30) Foreign Application Priority Data

Jul. 15, 2003    (JP)    ............................. 2003-197086

(51) Int. Cl.
*G11C 16/04*    (2006.01)
(52) U.S. Cl. ............................ 365/185.11; 365/185.12; 365/185.13
(58) Field of Classification Search ............ 365/185.11, 365/185.12, 185.13, 185.17
See application file for complete search history.

(56) References Cited

U.S. PATENT DOCUMENTS 6,031,764 A * 2/2000 Imamiya et al. ....... 365/185.29
6,049,494 A   4/2000 Sakui et al.
6,064,611 A   5/2000 Tanaka et al.
2005/0105335 A1* 5/2005 Sugimae et al. ....... 365/185.17

OTHER PUBLICATIONS

K-D. Suh, et al., IEEE Journal of Solid-State Circuits, vol. 30, No. 11, pp. 1149-1156, "A 3.3 V 32 Mb NAND Flash Memory With Incremental Step Pulse Programming Scheme", Nov. 1995.

* cited by examiner

*Primary Examiner*—Richard Elms
*Assistant Examiner*—Dang Nguyen
(74) *Attorney, Agent, or Firm*—Oblon, Spivak, McClelland, Maier & Neustadt, P.C.

(57) ABSTRACT

The number of electrons existing in a channel region within a NAND cell unit is reduced, and erroneous write-in characteristics are improved by the present invention. A nonvolatile semiconductor memory includes a control gate line drive circuit, which writes simultaneously in all memory cell transistors connected to a selected control gate line, performs write-in by maintaining a low channel voltage for a selected memory transistor in a selected memory cell unit when a plus voltage is applied to the selected control gate line, and restricts write-in utilizing a voltage self-boosted from the channel voltage for an unselected memory transistor.

23 Claims, 34 Drawing Sheets

| | APPLIED VOLTAGE | ON/OFF STATE AT BOOST TIMING |
|---|---|---|
| SGD | Vsgd | OFF |
| WL1 | Vpass | ON |
| WL2 | Vpass | ON |
| WL3 | Vpass | ON |
| WLk-1 | Vpass | ON |
| WLk | Vpgm | ON |
| WLk+1 | Vpass | ON |
| WLn-1 | Vpass | ON |
| WLn | Vpass | ON |
| SGS | Vsgs | OFF |
| SL | Vsl | |
| BL1 | Vbl1 | |
| BL2 | Vbl2 | |

| | APPLIED VOLTAGE | ON/OFF STATE AT BOOST TIMING |
|---|---|---|
| SGD | Vsgd | OFF |
| WL1 | Vpass | ON |
| WL2 | Vpass | ON |
| WL3 | Vpass | ON |
| WLk-1 | Vcutoff | OFF |
| WLk | Vpgm | ON |
| WLk+1 | Vcutoff | OFF |
| WLn-1 | Vpass | ON |
| WLn | Vpass | ON |
| SGS | Vsgs | OFF |
| SL | Vsl | |
| BL1 | Vbl1 | |
| BL2 | Vbl2 | |

| | APPLIED VOLTAGE | ON/OFF STATE AT BOOST TIMING |
|---|---|---|
| SGD | Vsgd | OFF |
| WL1 | Vpass | ON |
| WL2 | Vpass | ON |
| WL3 | Vpass | ON |
| WLk-1 | Vpass | ON |
| WLk | Vpgm | ON |
| WLk+1 | Vcutoff | OFF |
| WLn-1 | Vpass | ON |
| WLn | Vpass | ON |
| SGS | Vsgs | OFF |
| SL | Vsl | |
| BL1 | Vbl1 | |
| BL2 | Vbl2 | |

| | APPLIED VOLTAGE | ON/OFF STATE |
|---|---|---|
| BL | Vbl | |
| SGD | Vsgd | ON |
| WL1 | 0 | ON |
| WL2 | 0 | ON |
| WL3 | 0 | ON |
| WL4 | 0 | OFF |
| WL5 | 0 | OFF |
| WLn | 0 | OFF |
| SGS | Vsgs | OFF |
| SL | Vsl | |

| | APPLIED VOLTAGE | ON/OFF STATE |
|---|---|---|
| BL | Vbl | |
| SGD | Vsgd | ON |
| WL1 | V1 | ON |
| WL2 | V1 | ON |
| WL3 | V1 | ON |
| WL4 | V1 | ON |
| WL5 | V1 | ON |
| WLn | V1 | ON |
| SGS | Vsgs | OFF |
| SL | Vsl | |

| | APPLIED VOLTAGE | ON/OFF STATE |
|---|---|---|
| BL | Vbl | |
| SGD | Vsgd | OFF |
| WL1 | Vpass | ON |
| WL2 | Vpass | ON |
| WL3 | Vpgm | ON |
| WL4 | Vpass | ON |
| WL5 | Vpass | ON |
| WLn | Vpass | ON |
| SGS | Vsgs | OFF |
| SL | Vsl | |

|  | APPLIED VOLTAGE | ON/OFF STATE |
|---|---|---|
| BL | Vbl |  |
| SGD | Vsgd1 | NORMALLY ON |
| WL1 | Vpass-pre | ON |
| WL2 | Vpass-pre | ON |
| WL3 | Vpass-pre | ON |
| WL4 | Vpass-pre | ON |
| WL5 | Vpass-pre | ON |
| WLn | Vpass-pre | ON |
| SGS | Vsgs | OFF |
| SL | Vsl |  |

MEMORY CARD 60
OR CARD HOLDER 80

NONVOLATILE SEMICONDUCTOR MEMORY

CROSS REFERRENCE TO RELATED APPLICATIONS

This application is based upon and claims the benefit of priority from prior Japanese Patent Application P2003-197086 filed on Jul. 15, 2003; the entire contents of which are incorporated by reference herein.

BACKGROUND OF THE INVENTION

1. Field of the Invention

The present invention relates to a nonvolatile semiconductor memory. It is particularly related to a nonvolatile semiconductor memory having characteristics for write-in methods.

2. Description of the Related Art

Conventionally, a NAND flash EEPROM is known as an electrically erasable and highly integrated nonvolatile semiconductor memory. A memory transistor for the NAND flash EEPROM has a structure in which charge accumulation layers or films and control gates are stacked with an inter lying insulating layer on a semiconductor substrate. A NAND cell unit is configured by connecting a plurality of memory cell transistors in series as columns in a shape such that neighboring memory cells share a common source or a drain region, and arranging select gate transistors at both sides thereof.

A memory cell array is configured with arranging NAND cell units in a matrix. In addition, NAND cell units arranged in rows are called a NAND cell block. Gates of select gate transistors arranged in the same row are connected to the same select gate line, and control gates of memory cell transistors arranged in the same row are connected to the same control gate line. When N memory cell transistors are connected in series in a NAND cell unit, N control gate lines are included in a single NAND cell block.

The nonvolatile memory cell transistor stores data defined by the charge accumulation state of a floating gate. Specifically, storage of binary data is performed with, for example, voltages resulting from injecting electrons into a floating gate through a channel which are higher than a certain threshold voltage as data "0" and lower voltages resulting from discharging the electrons stored in the floating gate through the same channel as data "1". Recently, a multiple-valued storage method such as a 4-valued storage has also been implemented by more finely controlling the threshold distribution.

When performing data write-in, to begin with, the entire data stored in the NAND cell block is erased all at once. This is performed by setting all control gate lines (word lines) of the selected NAND cell block to a low voltage Vss (for example, 0V), applying a high positive voltage Vera (erasure voltage, for example, 20V) to a p-well containing the cell array, and discharging the floating gate electrodes to the channel. Accordingly, all the data in the NAND cell block becomes data "1". Not only can a NAND cell block be erased all at once, but so can an entire chip.

Writing data is performed all at once after the collective data erasure described above for a plurality of memory cell transistors connected to the selected control gate lines. The write-in unit is normally defined as one page; however recently, there are instances where a plurality of pages is allotted to a single control gate line. The write-in order for the control gate lines in the NAND cell block may be an arbitrary order (random write-in), or an order in a certain single direction (sequential write-in). Sequential write-in is normally performed in an order from the control gate line on the source side.

Applying a high positive voltage Vpgm (a write-in voltage, for example, 20V) to the selected control gate line so as to write in a control gate line all at once allows execution of two types of simultaneous data write-in: in the case of data "0", electrons are injected from the channel to the floating gate (namely, "0" write-in), and in the case of data "1", electron injection is restricted (namely, write-restricted, or "1" write-in). Implementing such control gate line collective write-in requires controlling the channel voltage for the memory transistor depending on data. For example, in the case of data "0", the channel voltage is kept low, and when a write-in voltage Vpgm is applied to the control gate, a corresponding large electric field is impressed on the gate insulating film below the floating gate. On the other hand, in the case of data "1", electron injection to the floating gate is restricted by boosting the channel voltage and lowering the electric field to be impressed on the gate insulating film. At this time, if the boost in the channel voltage is insufficient, electron injection occurs and the threshold then fluctuates, even with a "1" write-in memory transistor. This phenomenon is hereafter called as, "an erroneous write-in". Implementing the write-in operation for NAND flash EEPROM requires controlling the threshold fluctuation due to an erroneous write-in within the specification limits so that faulty operations do not occur.

As methods for channel voltage control during write-in, a self-boosting (SB) write-in method as described in K. D. Suh, et.al, "A 3.3V 32 Mb NAND Flash Memory with Incremental Step Pulse Programming Scheme", IEEE JOURNAL OF SOLID-STATE CIRCUITS, VOL. 30. NO. 11, NOVEMBER 1995, p. 1149–1156, and a local self-boosting (LSB) method are known as disclosed in Japanese Laid-open Patent Application No. Hei 8-279297. In addition, an erasure area self-boosting (EASB) method has been proposed as disclosed in 8-279297. On the other hand, as a method for improving initial charging voltage, a channel voltage boosting method has been proposed, which increases the initial voltage by transferring a bit line voltage which does not go below the threshold through temporarily boosting the voltage of the bit line side select gate line during initial voltage transfer, as disclosed in Japanese Laid-open Patent Application No. Hei 10-223866.

As discussed above, the phenomenon where the threshold of a memory transistor, which needs to maintain an erased state, varies during the write-in operation in NAND flash EEPROM is called "erroneous write-in". There are two types of stress that cause "erroneous write-in": "Vpgm stress" and "Vpass stress".

The write-in restriction ("1" write-in) for unselected memory cell transistors, which are connected to a selected control gate line and to which are applied a write-in voltage Vpgm, is performed by boosting the channel voltage for the unselected memory cell transistors through capacitive coupling of one to a plurality of unselected control gate lines. An intermediate voltage Vpass is applied to all or a part of the unselected control gate lines for boosting the channel voltage, however, an erroneous write-in occurs if the intermediate voltage Vpass is too small. This stress applied to the unselected memory cell transistors is called "Vpgm stress".

On the other hand, since the channel voltage for the unselected memory cell transistors in the NAND cell unit to which "0" write-in is to be performed is small, erroneous write-in occurs if the aforementioned intermediate voltage Vpass is too large. When this type of stress is applied to the unselected memory cell transistors, it is called "Vpass stress".

There are two types of write-in order for the control gate lines in the NAND cell block: a random write-in method for writing in an arbitrary order regardless of control gate line location, and a sequential write-in method for writing in an order from, for example, the source side control gate line. Recently, however, there is a tendency to use the latter sequential write-in method. In the case of the sequential write-in method, all of the selected memory cell transistors and the unselected memory cell transistors closer to the bit line side are in an erased state, which greatly influences the erroneous write-in characteristics.

In order to reduce the Vpgm stress, several channel voltage control methods have been proposed. The conventional methods have been proposed from the perspective of how to increase the efficiency in boosting the channel voltage. However, the conventional methods are approaching a limitation, and improvement in boost efficiency is becoming difficult. The present invention proposes to increase the channel charge Qch prior to boosting so as to improve erroneous write-in characteristics by decreasing the number of electrons remaining in the channel.

In other words, the present invention provides a nonvolatile semiconductor memory which, in the case of performing sequential write-in, applies a dummy pulse to a control gate line before applying pulses of intermediate voltage Vpass and write-in voltage Vpgm so as to reduce the number of electrons existing in the channel and the diffusion layer region in a NAND cell unit, thereby improving channel voltage. Furthermore, a highly versatile nonvolatile semiconductor memory, which discharges excessively-introduced electrons from the NAND cell unit, is used in combination with the channel voltage boosting method.

SUMMARY OF THE INVENTION

An aspect of the present invention inheres in a nonvolatile semiconductor memory having a plurality of common control gate lines, a plurality of bit lines and a source line comprising: (a) a memory cell array including a memory cell block comprising a plurality of memory cell units arranged in parallel with each other in a row direction, each of the memory cell unit comprising: a plurality of memory cell transistors arranged in a column line; a first select gate transistor connected to the bit line at a first end of each of the memory cell transistors; and a second select gate transistor connected to the source line at a second end of each of the memory cell transistors so that the memory cell transistors arranged in a row can be connected to the common control gate line; and (b) a control gate line drive circuit configured to simultaneously write-in all of the memory cell transistors connected to a selected control gate line, wherein different types of voltages incapable of write-in applied at least once to all or a part of the control gate lines before applying a high plus voltage for write-in to the selected control gate line.

Another aspect of the present invention inheres in A nonvolatile semiconductor memory having a plurality of common control gate lines, a plurality of bit lines and a source line comprising: (a) a memory cell array including a memory cell block comprising a plurality of memory cell units arranged in parallel with each other in a row direction, each of the memory cell unit comprising: a plurality of memory cell transistors arranged in a column line; a first select gate transistor connected to the bit line at a first end of each of the memory cell transistors; and a second select gate transistor connected to the source line at a second end of each of the memory cell transistors so that the memory cell transistors arranged in a row can be connected to the common control gate line; and (b) a control gate line drive circuit configured to simultaneously write-in all of the memory cell transistors connected to a selected control gate line, wherein, before applying a plus first voltage intended for write-in to the selected control gate line, and applying a second voltage intended for boosting a channel voltage to at least a part or all of unselected control gate lines, a third voltage incapable for write-in is applied at least once to all or a part of the control gate lines.

The other aspect of the present invention inheres in A nonvolatile semiconductor memory having a plurality of common control gate lines, a plurality of bit lines and a source line comprising: (a) a memory cell array including a memory cell block comprising a plurality of memory cell units arranged in parallel with each other in a row direction, each of the memory cell unit comprising: a plurality of memory cell transistors arranged in a column line; a first select gate transistor connected to the bit line at a first end of each of the memory cell transistors; a second select gate transistor connected to the source line at a second end of each of the memory cell transistors so that the memory cell transistors arranged in a row can be connected to the common control gate line; and a select gate line connected to gates of the first select gate transistors arranged in the same row; and (b) a control gate line drive circuit configured to simultaneously write-in all of the memory cell transistors connected to a selected control gate line, wherein a first voltage for transferring a bit line voltage which does not go below a value of a threshold voltage is applied to the select gate line of the first select gate transistor; a second voltage smaller than the first voltage is applied to the select gate line of the first select gate transistor; different types of voltages incapable for write-in is applied at least once to at least a part or all of the control gate lines; and a high plus voltage is applied for write-in to the selected control gate line, whereby once the first voltage is applied, the second voltage, and the different types of voltages are applied before applying the high plus voltage.

BRIEF DESCRIPTION OF DRAWINGS

FIG. 9 is a diagram illustrating a condition of a channel in each stage of write-in;

FIG. 10 is a diagram for describing bias conditions corresponding to FIG. 9;

FIG. 11 is a diagram illustrating a condition of a channel in each stage of write-in;

FIG. 12 is a diagram for describing a bias condition corresponding to FIG. 11;

FIG. 13 is a diagram illustrating a condition of a channel in each stage of write-in;

DETAILED DESCRIPTION OF THE INVENTION

Figure 1:
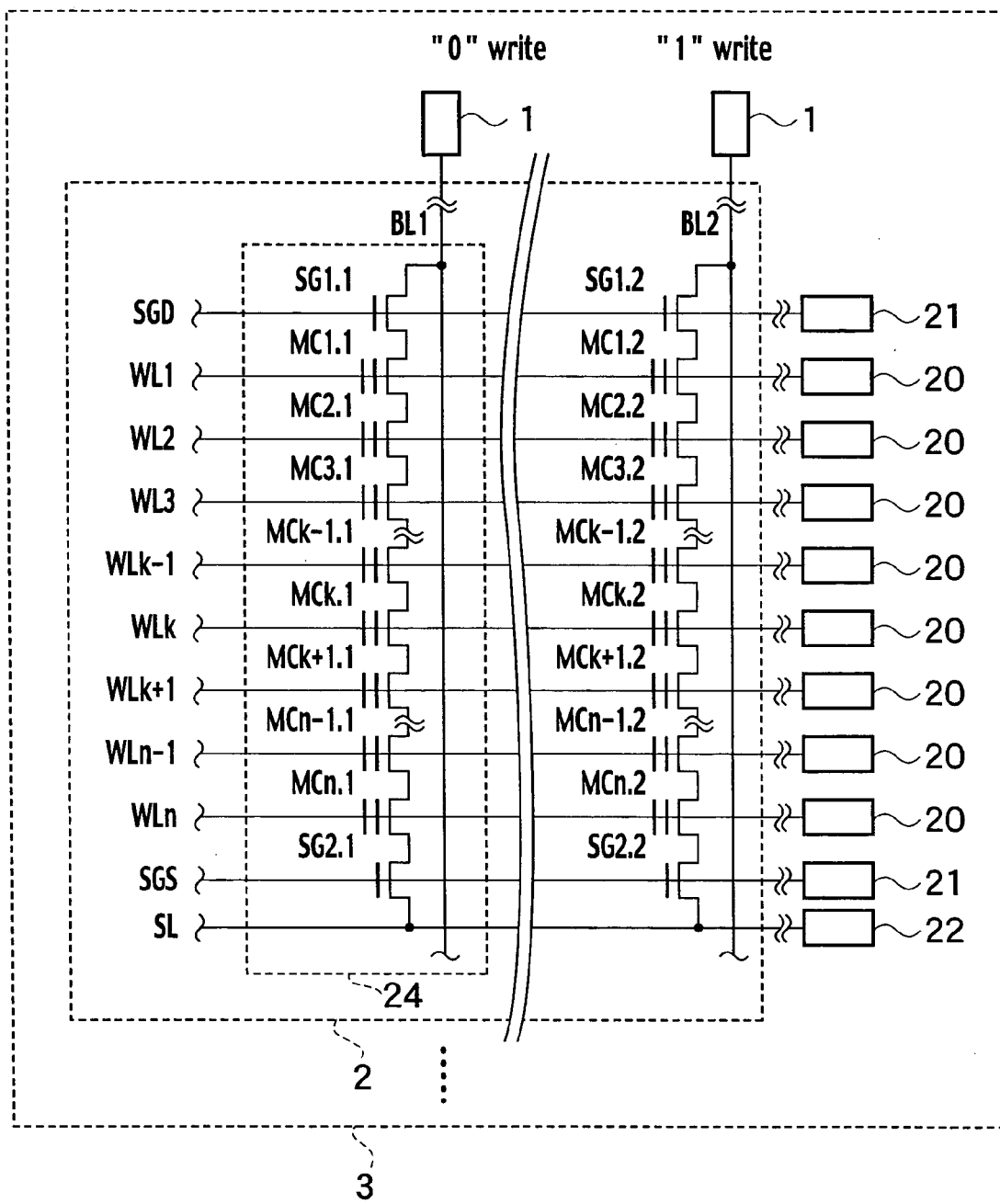
FIG. 1 is an equivalent circuit diagram for describing bias conditions for a self-boosting (SB) method of a first comparative example.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Embodiments of the present invention are described in detail forthwith while referencing the drawings. The same or similar symbols are applied to the same or similar parts in the appended drawings. In addition, the embodiments illustrated below exemplify devices and methods obtained by implementing the technical idea of the present invention, where the technical idea of the present invention is not limited thereto. The technical idea of the present invention may be modified into various modifications within the scope of the appended claims.

The self-boosting (hereinafter referred to as SB) method is described in the first comparative example; the local self-boosting (hereinafter referred to as LSB) method is described in the second comparative example; the electrically alterable self-boosting (hereinafter referred to EASB) method is described in the third comparative example; and the channel voltage boosting method, which improves the initial charging voltage, is described in the fourth comparative example. Moreover, in the first embodiment, the case where at least one dummy pulse is applied to each unselected control gate line and selected control gate line before applying Vpass and Vpgm pulses used for write-in is described. In the second embodiment, the case where two dummy pulses are applied to the unselected control gate lines, and at least one is applied to the selected control gate line is described. In the third embodiment, an example is described where there are k types of dummy pulses. In the fourth embodiment, an example is described where k types of voltage waveforms for the unselected control gate lines to which is applied a Vpass pulse are used, and h types of voltage waveforms for the unselected control gate lines that cut off the memory cell transistors are used. In the fifth embodiment, an example is described where k types of voltage waveforms for the unselected control gate lines to which is applied a Vpass pulse are used so as to temporarily boost the voltage of the selected gate lines up to Vsgd1. Furthermore, in the sixth embodiment, an example is described where the voltage for the selected gate lines is temporarily boosted up to Vsgd1 using k types of voltage waveforms for unselected control gate lines to which is applied a Vpass pulse, and h types of voltage waveforms for unselected control gate lines that cut off memory cell transistors. In the seventh embodiment, an example is described where the nonvolatile semiconductor memory disclosed in the above-mentioned first through sixth embodiments is configured as 64 M-bit NAND flash memory. Further, in the eighth embodiment, application examples for a system LSI, which is applicable to systems such as a memory card, an IC card or the like, are described.

COMPARATIVE EXAMPLE 1

(SB Write-in Method)

Figures 2, 3:
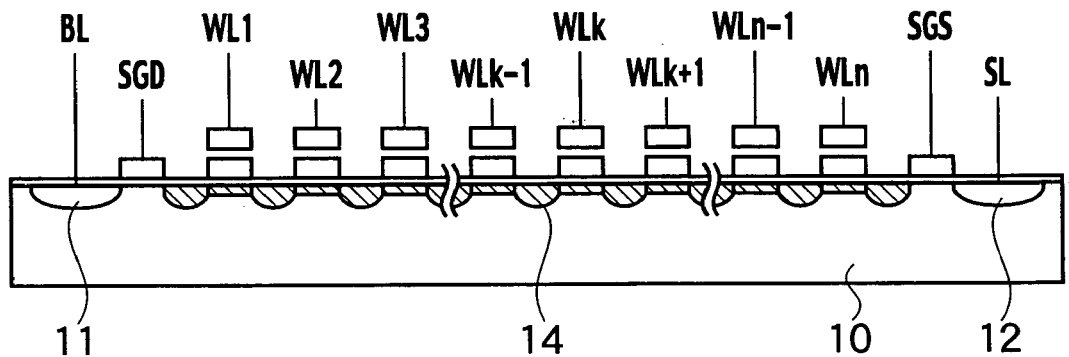
FIG. 2 is a diagram illustrating an aspect of channel voltage boost during "1" write-in according to the SB method of the first comparative example.
FIG. 3 is a diagram for describing bias conditions for the SB method of the first comparative example.

The SB write-in method is the most typical method for channel voltage control during write-in. In the case of data "1" write-in, the channel voltage is boosted through capacitive coupling from the control gate with the entire channel region in the NAND cell unit in a floating state. The SB method according to the first comparative example of the present invention is described in detail forthwith. FIG. 1 is a an equivalent circuit diagram of a NAND memory cell array 3 for describing bias conditions for the SB method; FIG. 2 is a diagram illustrating an aspect of channel voltage boost during "1" write-in according to the SB method; and FIG. 3 is a diagram for describing bias conditions for the SB method. FIG. 1 illustrates a configuration of a NAND flash memory circuit, where n memory cell transistors MC1.1 to MCn.1 are connected in series so as to configure a memory cell unit 24 having a NASND string. Further, at the ends of this NAND string, a bit line side select gate transistor SG1.1 is connected on the bit line BL1 side, and a source line side select gate transistor SG2.1 is connected on the source line side, coupling the NAND string to each of the bit line BL1 and the source line SL. Similarly, neighboring n memory cell transistors MC1.2 to MCn.2 are connected in series so as to configure a NAND string. Further, at the ends of this NAND string, a bit line side select gate transistor SG1.2 is connected on the bit line BL2 side, and a source line side select gate transistor SG2.2 is connected on the source line side, coupling the NAND string to each of the bit line BL2 and the source line SL. A select gate line SGS is connected in common to the gates of the source side select gate transistors SG2.1 and SG2.2, and a select gate line SGD is connected in common to the gates of the source side select gate transistors SG1.1 and SG1.2. A NAND string is selected using the select gate lines SGD and SGS. Word lines WL1, WL2, WL3, ..., WLk−1, WLk, WLk+1, ..., WLn−1, WLn are connected in common to the gates of the n memory cell transistors MC1.1 to MCn.1 and n memory cell transistors MC1.2 to MCn.2, respectively. Furthermore, a bit line drive circuit 1 is connected to the bit lines BL1 and BL2, a control gate line drive circuit 20 is connected to the word lines WL1, WL2, WL3, ..., WLk−1, WLk, WLk+1, ..., WLn−1, WLn, a select gate line drive circuit 21 is connected to the select gate lines SGD and SGS, and a source line drive circuit 22 is connected to the source line SL. FIG. 1 shows two memory cell units 24 including a NAND string, respectively, however, additional NAND units may be further arranged along the extension of the bit lines and the word lines so as to constitute a memory cell block 2 in a memory cell array 3.

FIG. 2 schematically represents a device cross-sectional structure of a single NAND string sandwiched between the bit line BL and the source line SL. In a semiconductor substrate 10, a bit line contact area 11 and a source line contact area 12 are formed, and the n memory cell transistors are formed with a source and a drain region as common regions in series in diffusion regions. In FIG. 2, channel voltage boost during "1", write-in, according to the SB method, is schematically represented by a shaded portion denoted by a boost area 14. Furthermore, a bias relationship given to the word lines WL1, WL2, WL3, . . . , WLk−1, WLk, WLk+1, . . . , WLn−1, WLn, the select gate lines SGD and SGS, the source line SL, and the bit lines BL1 and BL2 corresponding to FIG. 1 and FIG. 2 are shown in FIG. 3.

Voltages Vbl1 and Vbl2 are applied to the bit lines in conformity with data "0" and data "1" before applying a write-in voltage to a control gate line (a word line). The value of 0V, for example, may be use as Vbl1, and 1.2 to 4.0 V, for example, may be used as Vbl2. The bit line side select gate transistors SG1.1 and SG1.2 must be turned on for transferring the bit line voltage Vbl1 for a "0" write-in NAND cell unit, and the bit line side select gate must be made to automatically turn off during channel voltage boost for a "1" write-in NAND cell unit.

Namely, the bit line side select gate line SGD is applied a gate voltage Vsgd satisfying the relationship $$Vth\_sgd(0) < Vsgd < Vbl2 + Vth\_sgd(Vbl2)$$

(Vth_sgd denotes the bit line side select gate threshold, and within (0) and (Vbl2) denotes the back bias voltage to be applied to the bit line side select gate transistor source). Typically, the same value as that given to the "1" write-in bit line voltage (Vbl2 in this case) is often given to Vsgd. The source side select gate line SGS has a voltage Vsgs applied (for example, 0V) that makes the source side select gate transistors SG2.1 and SG2.2 to be cut off. Subsequently, as shown in FIG. 3, a write-in voltage Vpgm is applied to the word line (select control gate line) WLk that is used for write-in, and an intermediate voltage Vpass (for example, 10V) that is lower than the Vpgm is applied to the other unselected word lines (unselected control gate lines) WL1 to WLk−1, and WLk+1 to WLn. The channel voltage for the "0" write-in NAND cell unit is fixed at Vbl1 so that a corresponding large electric field is applied to the gate insulating film of a selected memory transistor, and electrons are then injected to the floating gate due to the tunneling effect. Meanwhile, with a "1" write-in, by two select gate transistors at both sides of the NAND cell unit being in a cut-off state, as shown in FIG. 2, the channel and diffusion layer of all memory cell transistors, which are serially connected, enter a floating state. Accordingly, the voltage of the channels and diffusion layers are boosted to a specified channel voltage Vch due to capacitive coupling to the control gate lines, thereby allowing reduction of the electric field applied to the gate insulating film and suppression of electron injection to the floating gates. Note that the second column from the left of the table in FIG. 3 represents the applied voltage, and the third column represents the conductive state (ON/OFF) of each transistor during boosting.

Channel voltage Vch during self-boosting is considered to be represented by the following series of equations.

$$Vch = Vch\_init + CR1 \cdot (Vpass - Vthbk - Vch\_init) + CR2 \cdot (Vpgm - Vth - Vch\_init) \quad (1)$$

$$Vch\_init = Vsgd - Vth\_sgd \quad (2)$$

$$Ct = N \cdot Cch + N \cdot Cins \quad (3)$$

$$Cr1 = (N-1) \cdot Cins / Ct \quad (4)$$

$$Cr2 = Cins / Ct \quad (5)$$

where Vch_init denotes the channel voltage initial value, Vth denotes the selected memory transistor threshold, Vthbk denotes the unselected memory transistor threshold, Cp denotes the memory transistor coupling ratio, Cr1 denotes a boost ratio that is multiplied by Vpass, Cr2 denotes a boost ratio that is multiplied by Vpgm, Cins denotes the capacitance between a single memory transistor's control gate and the substrate, Cch denotes the sum of the channel depletion layer capacitance and the diffusion layer junction capacitance of a single memory transistor, Ct denotes the total coupled capacitance to the boost region, and N denotes the number of memory cell transistors included in the NAND boost region. In addition, given that Cox is the capacitance between the floating gate and the substrate of a memory transistor, and Cono is the capacitance between the control gate and the floating gate of a memory transistor, channel voltage Vch is represented by Cins=Cox·Cono/(Cox+Cono). As the control gate voltage rises during Vpass pulse application, the boost region (the channel and diffusion layer of all memory cell transistors with the SB method) is electrically separated from the select gate transistor upon reaching Vthbk+Vch_init. The initial voltage transferred to the channel up to that point is Vch_init. According to Equation (1), channel voltage Vch is a sum of Vpass and Vpgm through boost ratios Cr1 and Cr2. As indicated by Equations (4) and (5), the characteristics of the SB method is that channel voltage Vch is virtually determined by Vpass since Cr2 is 1/(N−1) of Cr1 and small.

COMPARATIVE EXAMPLE 2

(LSB Write-in Method)

Figures 4, 5:
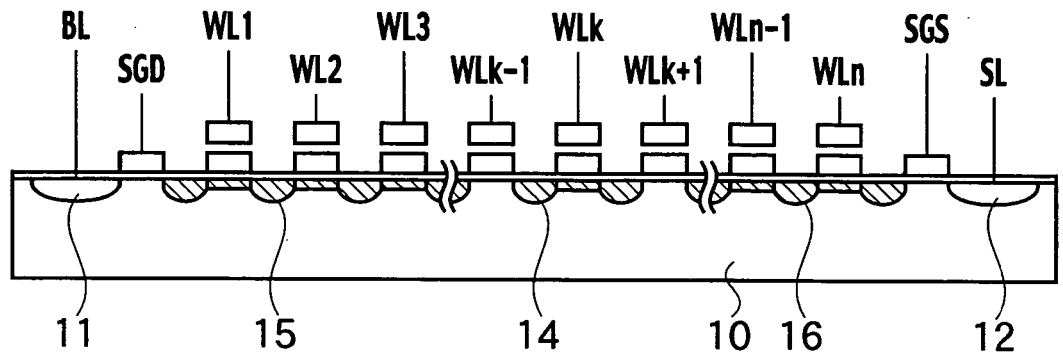
FIG. 4 is a diagram illustrating an aspect of channel voltage boost during "1" write-in according to a local self-boosting (LSB) method of a second comparative example.
FIG. 5 is a diagram for describing bias conditions for the LSB method of the second comparative example.

The LSB write-in method, as shown in FIG. 4 and FIG. 5, is a channel voltage control method, which boosts the voltage by cutting off neighboring memory cell transistors on both sides of the selected memory transistor so as to electrically separate only the channel and diffusion layer (boost region 14 in FIG. 4) of the selected memory transistor from the other transistors and then enters a floating state. The LSB method normally employs sequential write-in by which write-in is performed in order from the aforementioned source side control gate line (word line) Wln. As shown in FIG. 4, according to the LSB method, a channel voltage higher than that which is provided by using the SB method may be achieved. Specifically, a write-in voltage Vpgm is applied to the control gate line WLk for the selected memory transistor, a cut-off voltage Vcutoff, which is a low voltage (for example, 0V), is applied to the neighboring control gate lines WLk−1 and WLk+1 on both sides of the selected gate transistor to achieve cut-off, and an intermediate voltage Vpass between Vpgm and Vcutoff is applied to the other unselected control gate lines (FIG. 5). Viewed in line with the previous equations, since the number of memory cell transistors to be boosted is one (N=1) with the LSB method, the boost ratio is Cr2=Cins/(Cch+Cins), which is larger than that of the SB method. In addition, since the boost ratio Cr2 is multiplied by the write-in voltage Vpgm, the third term of Equation (1) is extremely large (the second term is zero), and thus the attained channel voltage is larger than that of the SB method.

COMPARATIVE EXAMPLE 3

(EASB Method)

Figures 6, 7:
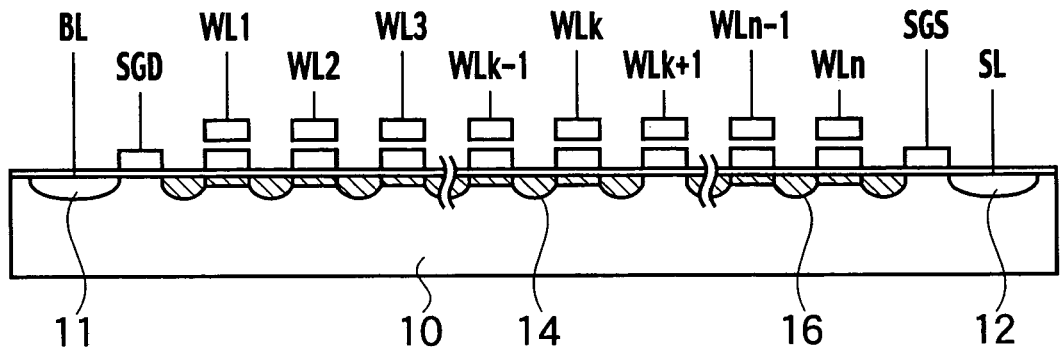
FIG. 6 is a diagram illustrating an aspect of channel voltage boost during "1" write-in according to an erasure area self-boosting (SB) method of a third comparative example.
FIG. 7 is a diagram for describing bias conditions for the erasure area SB method of the third comparative example.

The EASB method, as shown in FIG. 6 and FIG. 7, is a channel voltage control method, which cuts off the control gate line WLk+1 for the adjacent memory transistor on the source side of the selected memory transistor by applying a low cut-off voltage Vcutoff, applies a write-in voltage Vpgm to the control gate line WLk for the selected memory transistor, and applies an intermediate voltage Vpass to the remaining unselected control gate lines. The EASB method is based on sequential write-in by which write-in is performed in order from the aforementioned source side control gate line WLn. In this case, as shown in FIG. 6, the region to be boosted is limited to a selected memory transistor and a memory transistor (boost region 14 in FIG. 6) located further along the bit line side thereof. A merit of the EASB method is that since all memory cell transistors in the region to be boosted for sequential write-in are in an erased state and the second term in the previous Equation (1) substantially increases, a channel voltage higher than that achieved by the SB method may be obtained.

(Operation Waveform and Operation Mode)

The LSB method and EASB method described above are achieve a high channel voltage by increasing the boost efficiency for the channel voltage. However, in view of boost efficiency, it is difficult to achieve results greater than with the LSB method, and a different approach is necessary for achieving an even higher channel voltage.

Figure 8:
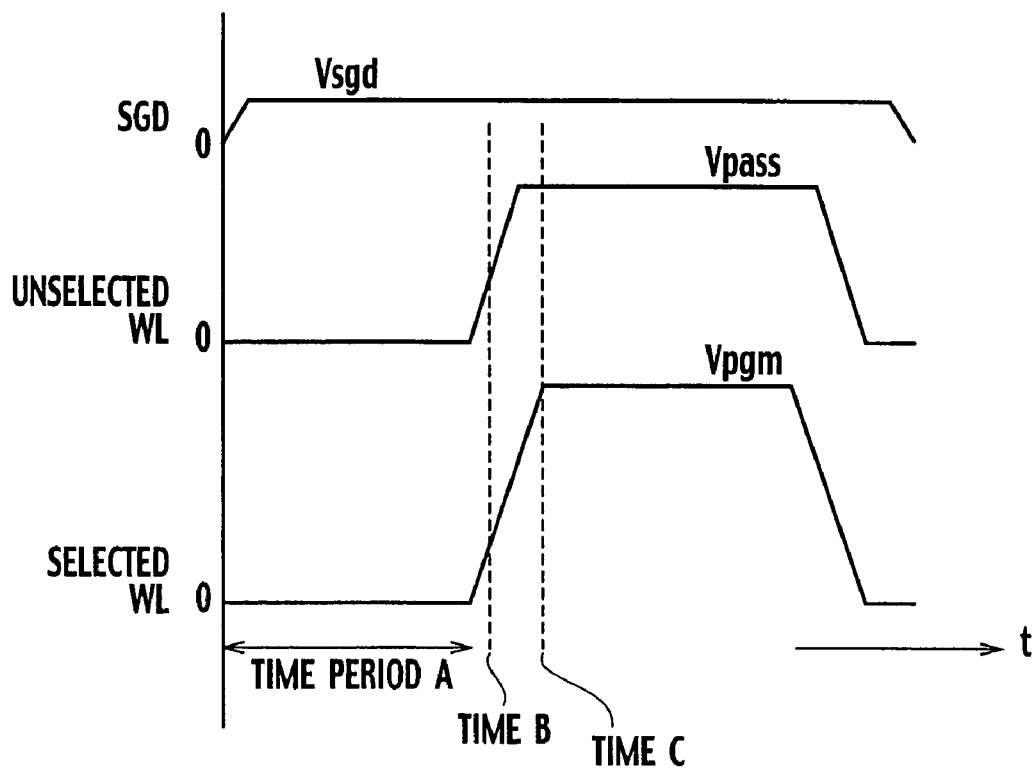
FIG. 8 is a diagram illustrating voltage waveforms during write-in according to the SB method of the third comparative example.
Figure 9:
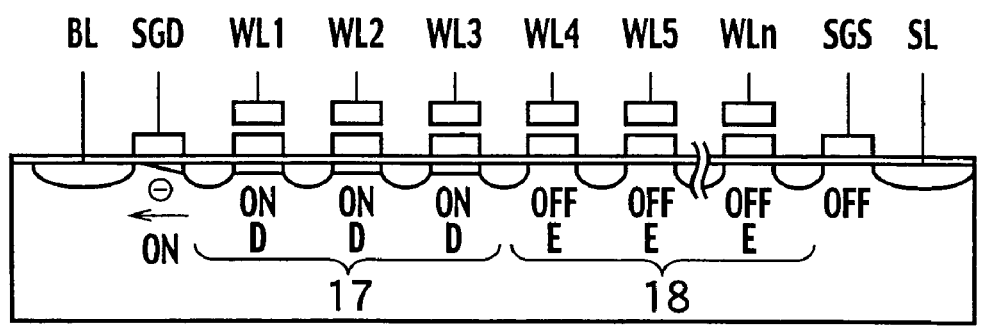
Figures 10, 11:
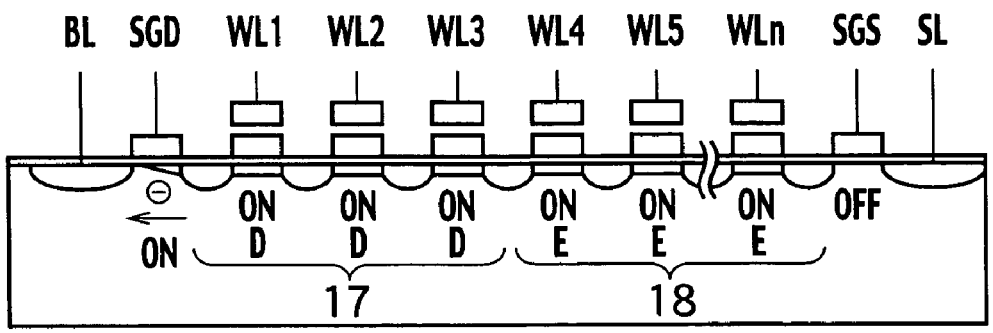
Figures 12, 13:
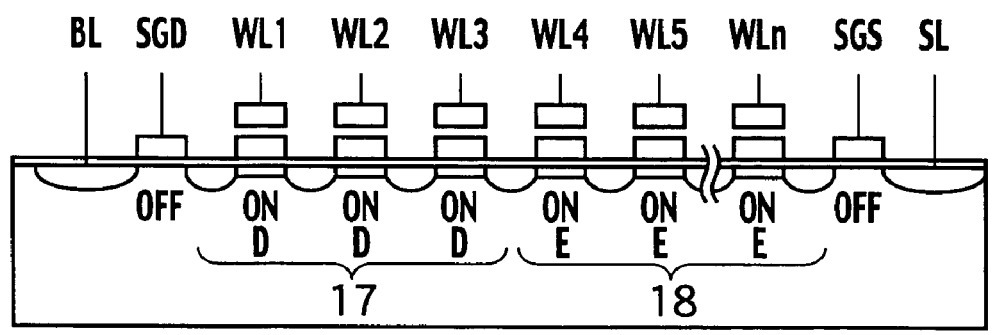
Figures 14, 15:
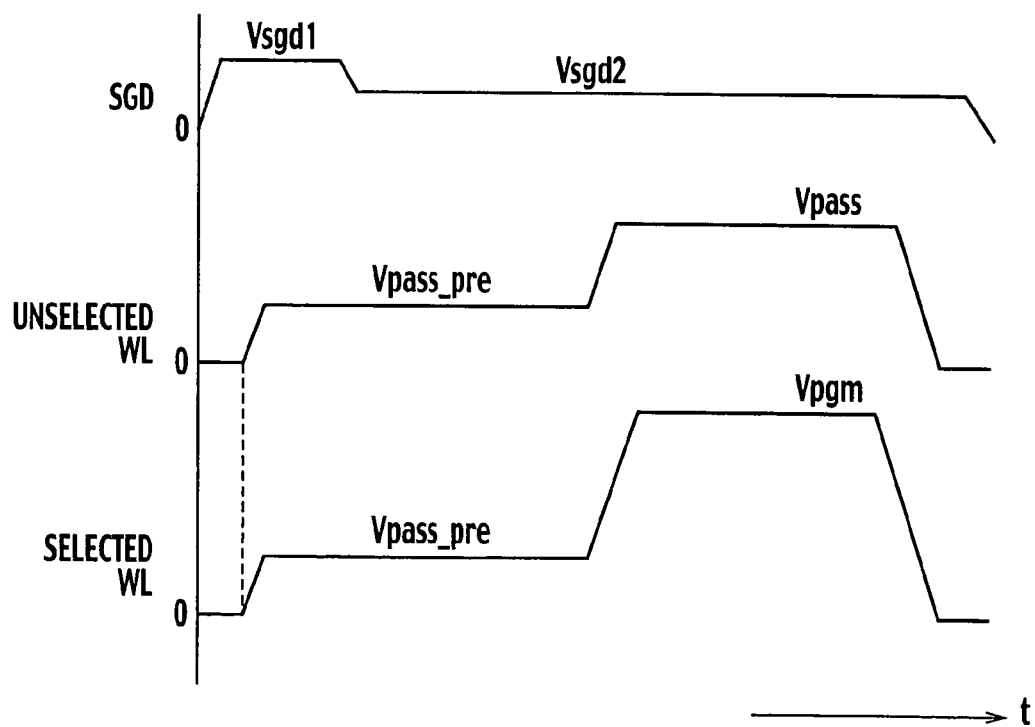
FIG. 14 is a diagram for describing a bias condition corresponding to FIG. 13.
FIG. 15 is a diagram illustrating voltage waveforms during write-in according to a method that transfers a bit line voltage which does not go below the threshold through temporarily boosting the voltage of the bit line side select gate line of the third comparative example.

No matter what channel voltage control method is adopted, to begin with, initial charging is performed via the bit line side select gate transistor in the "1" write-in memory cell unit. This initial charging is described taking the SB method as an example. To begin with, the condition before applying the intermediate voltage Vpass and write-in voltage Vpgm pulses (time region A in FIG. 8) is considered. In the "1" write-in NAND cell unit, Vsgd is applied to the bit line Vbl, and Vsgd is applied to the bit line side select gate line SGD, as shown in FIG. 9 and FIG. 10. For example, Vsgd uses the same value as Vbl. In such bias relationship, when the source side diffusion layer voltage of the bit line side select gate transistor connected to the bit line side select gate line SGD is Vsgd−Vth_sgd or less, electrons are extracted from the channel and the diffusion layer region (region 17 in FIG. 9) of an erased memory transistor, which continues to the bit line side select gate transistor connected to the bit line side select gate line SGD, and discharged to the bit line BL. As a result, this region 17 becomes positively charged. Next, the memory cell transistors in a written region 18 are assumed to be ON (time B in FIG. 8) during the course of raising the intermediate voltage Vpass and write-in voltage Vpgm pulses. As shown in FIG. 11 and FIG. 12, the channels and diffusion layers of all the memory cell transistors are in a serially-connected state at this time. Accordingly, movement of electrons in all the channels is possible, and a part of the stored electrons in the region 18 are discharged at this time. Voltage V1 in FIG. 12 denotes the control gate voltage when the memory cell transistors in the written region 18 are turned on. Since the bit line side select gate transistor connected to the bit line side select gate line SGD is cut off when its channel voltage reaches the value: Vsgd−Vth_sgd, all channels and diffusion layer regions are in a floating state thereafter, and the voltage is boosted through capacitive coupling with the control gate line voltage as an integrated configuration. Conditions at the time when pulse rising is completed (time C in FIG. 8) is shown in FIG. 13 and FIG. 14. According to the above explanation, transfer of the initial voltage with the SB method occurs near the time B described above.

When it is considered that a floating gate (FG) voltage of the memory cell transistor is Vfg_init=Vfgth+Vch_init (Vfgth denotes the memory transistor threshold when viewed from the floating gate) at time B, in order to completely transfer the initial voltage, and given that the initial voltage is Vch_init (=Vsgd−Vth_sgd), electrical charge Qch within the channel is represented by the following equation where, as an example, N=16.

$$Qch = 16Cox \cdot (Vch\_init - Vfg\_init) + 16Cch \cdot Vch\_init \quad (6)$$

$$= -16Cox \cdot Vfgth + 16Cch \cdot Vch\_init$$

In other words, if the channel is charged with electrical charge Qch and junction leaks or the like is sufficiently small, this charge may be maintained even after time B.

On the contrary, if the electrical charge Qch within the channel can be increased prior to write-in voltage Vpgm pulse application, in accordance with $$\Delta Vch = \Delta Qch/Ct \quad (7)$$

the channel voltage can be increased.

COMPARATIVE EXAMPLE 4

(Bit Line Side Select Gate Line SGD Voltage Boosting Method)

Exemplary voltage waveforms used with this method are shown in FIG. 15. The bit line side select gate line SGD voltage boosting method is a channel voltage boosting method, which increases the initial voltage by transferring a bit line voltage which does not go below the threshold through temporarily boosting the bit line side select gate line (Vsgd1 in FIG. 15) during initial voltage transfer. For example, by using a value larger than Vbl+Vth_sgd as Vsgd1 in FIG. 15, transferring Vbl is possible. By using Vsgd2 that has the same value as, for example, the Vbl, the bit line side select gate transistor connected to the bit line side select gate line SGD can be cut off during channel boost. Applying a voltage (in this case, the voltage is referred to as Vpass_pre, hereafter) that makes all memory cell transistors within a NAND cell unit turn on in accordance with select gate line SGD boost is necessary for obtaining the initial voltage increasing effect.

Figures 16, 17:
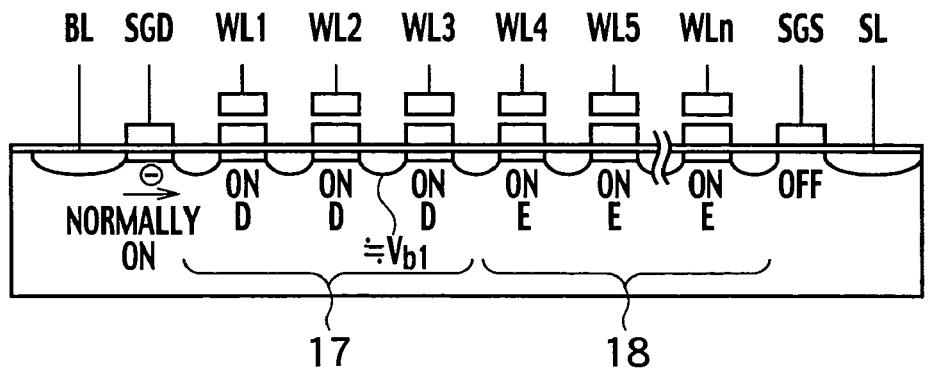
FIG. 16 is a diagram showing a condition of a channel during select gate line voltage boost.
FIG. 17 is a diagram for describing a bias condition corresponding to FIG. 16.

As a result of actual measurement, using this method, erroneous write-in characteristics deteriorated with the use of an excessively large Vpass_pre voltage. The cause thereof, as shown in FIG. 16 and FIG. 17, is that the select gate transistor SGD is normally in an ON state during Vsgd1 application since a voltage with larger value than Vth_sgd is used for Vsgd1. Since electrons flow into the NAND cell unit if Vpass_pre is exceedingly large, electrical charge Qch in the channel decreases more than with the usual SB method, and thus the erroneous write-in characteristics deteriorate. Accordingly, there is a problem where the bit line side select gate line SGD voltage boosting method needs Vpass_pre voltage to be adjusted to an optimum value.

[Embodiments]

Embodiments of the present invention are described in detail forthwith while referencing the drawings. The same or similar symbols are applied to the same or similar parts and throughout the appended drawings. In addition, the embodiments given forthwith illustrate devices and methods for embodying the technical idea of the present invention, and the technical idea of the present invention is not limited to the following. The technical idea of the present invention may be given various modifications within the scope of the appended claims.

(First Embodiment)

Figure 18:
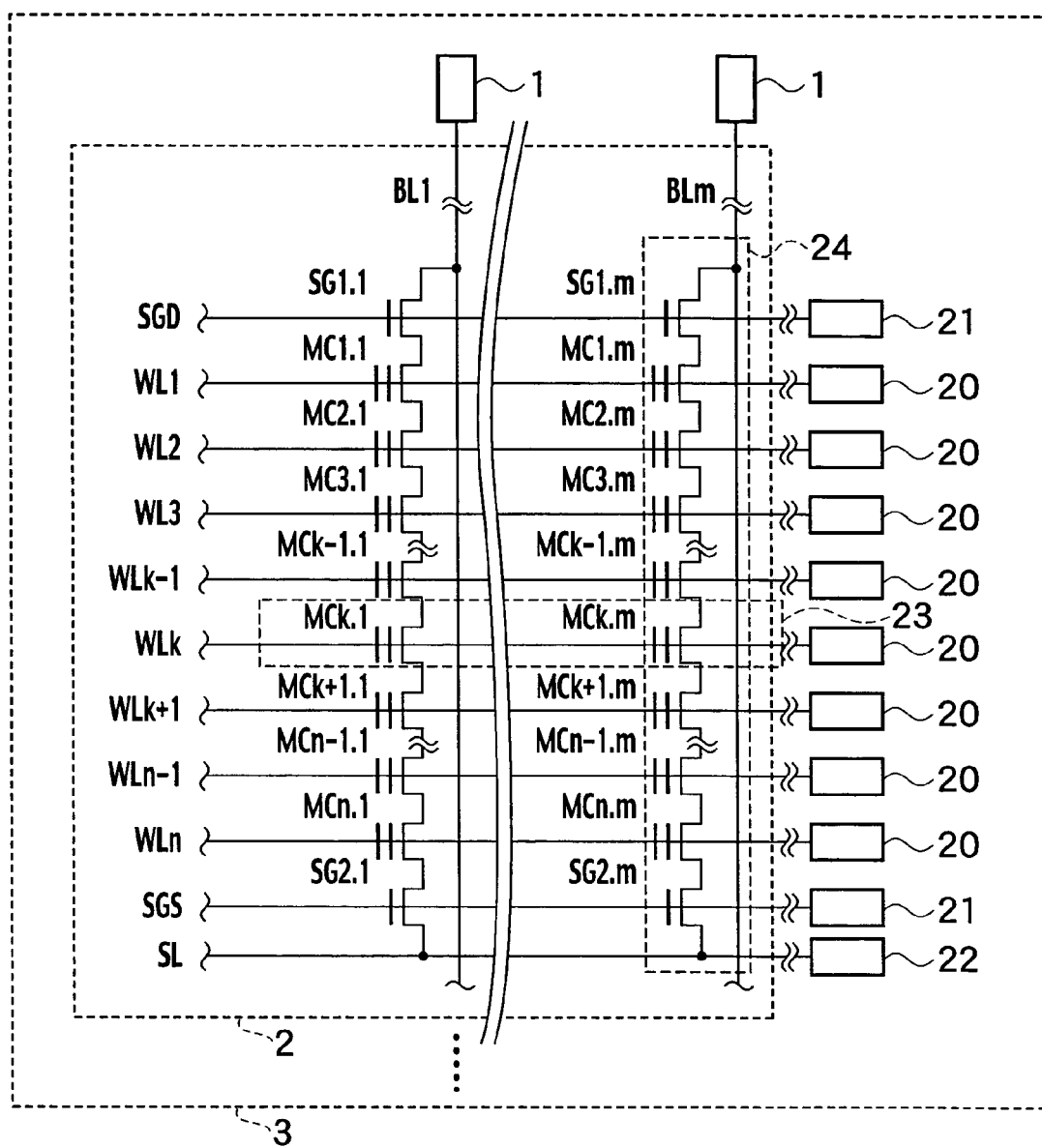
FIG. 18 is a diagram illustrating the circuitry of a NAND EEPROM cell array of a nonvolatile semiconductor memory according to a first embodiment of the present invention.

A NAND memory array structure is shown in FIG. 18. A memory cell transistor has a structure where a charge accumulation layer or film and a control gate are stacked via an insulating film on a semiconductor substrate. A NAND cell unit 24 is configured by connecting n memory cell transistors (MC1,m to MCn,m) in series as a column in a shape such that neighboring memory cells share a source or a drain diffusion layer, and arranging select gate transistors (SG1.m and SG2.m) at both sides thereof. The NAND memory cell array 3 has the above memory cell units 24 arranged in a matrix. A plurality of NAND cell units 24 in parallel with each other arranged in a row direction constitutes a NAND type memory cell block 2. The drain of one of the select gate transistors (SG1.m) of each NAND cell unit 24 is connected to the bit line (BLm), and the source of the other select gate transistor (SG2.m) is connected to the source line (SL) common to a plurality of NAND cell units 24. On the other hand, the control gates of a plurality of memory cell transistors or select gate transistors arranged in a row of the NAND memory cell array 3 are connected in common to the control gate line WLk and the select gate lines (SGD, SGS), respectively. All memory cell transistors 23 connected to a single control gate line WLk have data written therein, all at once. That is, an operational mode of "all at once" means simultaneous write-in/read-out operational mode. The write-in unit is normally defined as one page; however recently, there are cases where a plurality of pages is allotted to a single control gate. When there are n memory cell transistors in the NAND cell unit, there are also n control gate lines in the memory block 2. Bit lines BL1 and BL2 are connected to a bit line drive circuit 1, the control gate line is connected to a control gate line drive circuit 20, the select gate line is connected to a select gate line drive circuit 21, and the source line is connected to a source line drive circuit 22.

Figure 19:
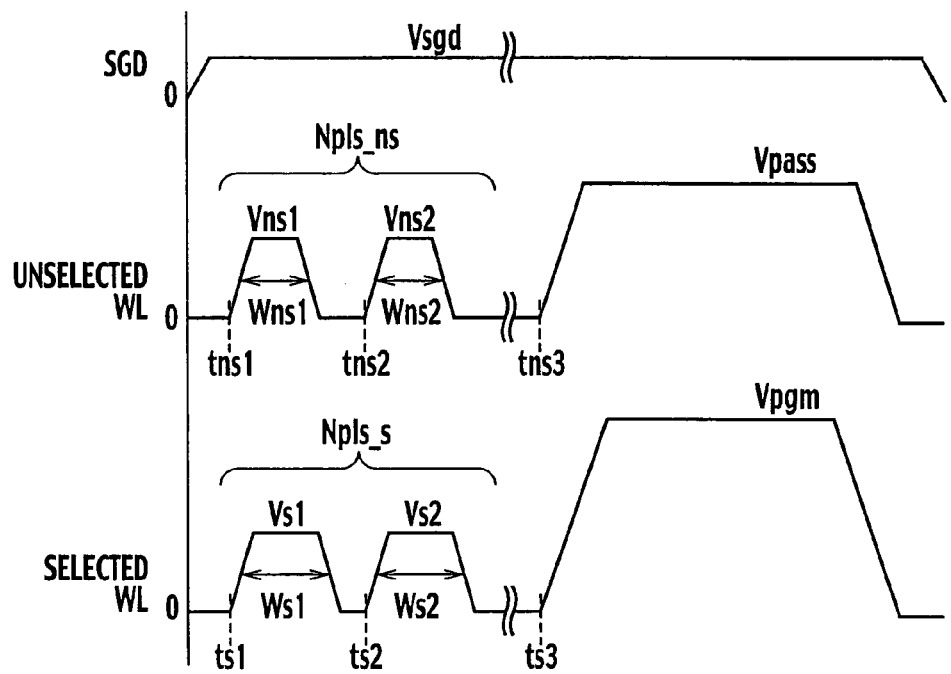
FIG. 19 is a diagram illustrating voltage waveforms during write-in according to the first embodiment of the present invention.

Write-in voltage waveforms used in this embodiment are shown in FIG. 19. A pulse as in the diagram is applied through one write-in to a selected control gate line and an unselected control gate line, respectively. The pulse differs from the comparative examples in that m (m denotes one or more) dummy pulses are applied before applying Vpass and Vpgm pulses used for write-in. The number, width, time and peak voltage of dummy pulses is not particularly limited. For example, a pulse voltage of approximately 4 to 6V, and a pulse number of approximately 1 to 3 may be used so as to turn on the written memory transistor.

Furthermore, when sequentially writing to all control gate lines in the aforementioned selected memory cell block, write-in is performed by selecting memory cell blocks in an order from the first control gate line on the source line SL side towards the bit line BL side.

As shown in FIG. 19, where a voltage Vsgd is applied to the bit line side select gate line SGD, two dummy pulses are applied to the unselected control gate line WL. Pulse widths are Wns1 and Wns2 and pulse height values are Vns1 and Vns2, respectively. An example where two dummy pulses are also applied to the selected control gate line WL is given. Pulse widths are Ws1 and Ws2 and pulse height values are Vs1 and Vs2, respectively. The dummy pulse to be applied to the unselected control gate line WL is not limited to two pulses, and the number of pulses may be Npls_ns. Similarly, the dummy pulse to be applied to the selected control gate line WL is not limited to two pulses, and the number of pulses may be Npls_s. Pulse rise times are denoted by tns1, tns2, tns3, ts1, ts2, and ts3 for respective pulses. A voltage that is not intended for write-in, namely the time necessary for applying a dummy pulse voltage, may differ for every control gate line. Furthermore, the time Wns1 and Wns2 necessary for applying a voltage not intended for write-in to the unselected control gate lines may be set shorter than the time Ws1 and Ws2 necessary for applying a dummy pulse voltage to the selected control gate lines. Namely, the dummy pulse voltage is the voltage that is not intended for write-in to the selected control gate lines.

Furthermore, the time necessary for applying a dummy pulse voltage not intended for the above write-in to an unselected control gate line, which is located further along the bit line side from the selected control gate line, may be set shorter than the time necessary for applying a dummy pulse voltage not intended for the above write-in to the selected control gate line and the unselected control gate line, which is located further along the source line side from the selected control gate line.

(First Modified Example of the First Embodiment)

Figure 20:
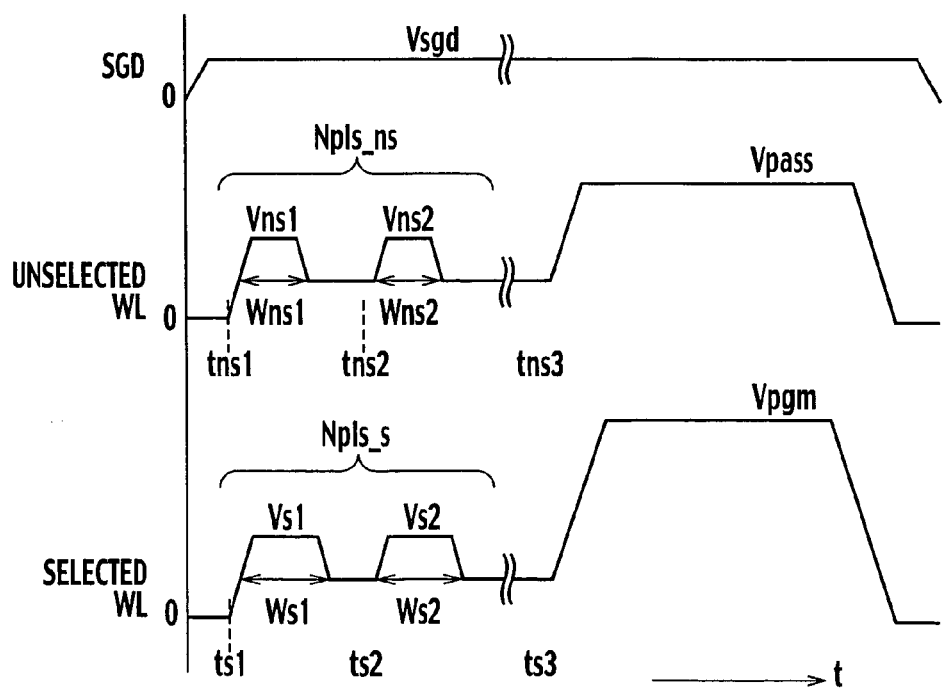
FIG. 20 is a diagram illustrating voltage waveforms during write-in according to a first modified example of the first embodiment of the present invention.

FIG. 20 is a diagram illustrating write-in voltage waveforms used in a first modified example of the first embodiment. A pulse as in the diagram is applied through one write-in to a selected control gate line and an unselected control gate line, respectively. The modification differs from the first embodiment in that one or more dummy pulses having a plus offset voltage are applied to the selected control gate line and the unselected control gate line before applying Vpass and Vpgm pulses used for write-in. The number, width, time and peak voltage of the dummy pulses is not particularly limited. For example, a pulse voltage of approximately 4 to 6V, and the number of pulses may be approximately 1 to 3 so as to turn on the written memory transistor.

As shown in FIG. 20, in the state where a voltage Vsgd is applied to the bit line side select gate line SGD, two dummy pulses are applied to the unselected control gate line WL. Pulse widths are Wns1 and Wns2 and pulse height values are Vns1 and Vns2, respectively. An example is given where two dummy pulses are also applied to the selected control gate line WL. Pulse widths are Ws1 and Ws2 and pulse height values are Vs1 and Vs2, respectively. The dummy pulse to be applied to the unselected control gate line WL is not limited to two, and the pulse number may be Npls_ns. Similarly, the dummy pulse to be applied to the selected control gate line WL is not limited to two, and the pulse number may be Npls_s. The pulse rise times are denoted by tns1, tns2, tns3, ts1, ts2, and ts3 for respective pulses. The voltage that is not intended for write-in, namely the time necessary for applying a dummy pulse voltage, may differ for every control gate line. Furthermore, the time Wns1 and Wns2 necessary for applying a voltage not intended for write-in to the unselected control gate lines may be set shorter than the time Ws1 and Ws2 necessary for applying a dummy pulse voltage to the selected control gate lines. Namely, the dummy pulse voltage is the voltage that is not intended for write-in to the selected control gate lines.

Furthermore, the time necessary for applying a dummy pulse voltage not intended for the above write-in to an unselected control gate line, which is located further along the bit line side from the selected control gate line, may be set shorter than the time necessary for applying a dummy pulse voltage not intended for the above write-in to the selected control gate line and the unselected control gate line, which is located further on the source line side from the selected control gate line.

(Second Modified Example of the First Embodiment)

Figure 21:
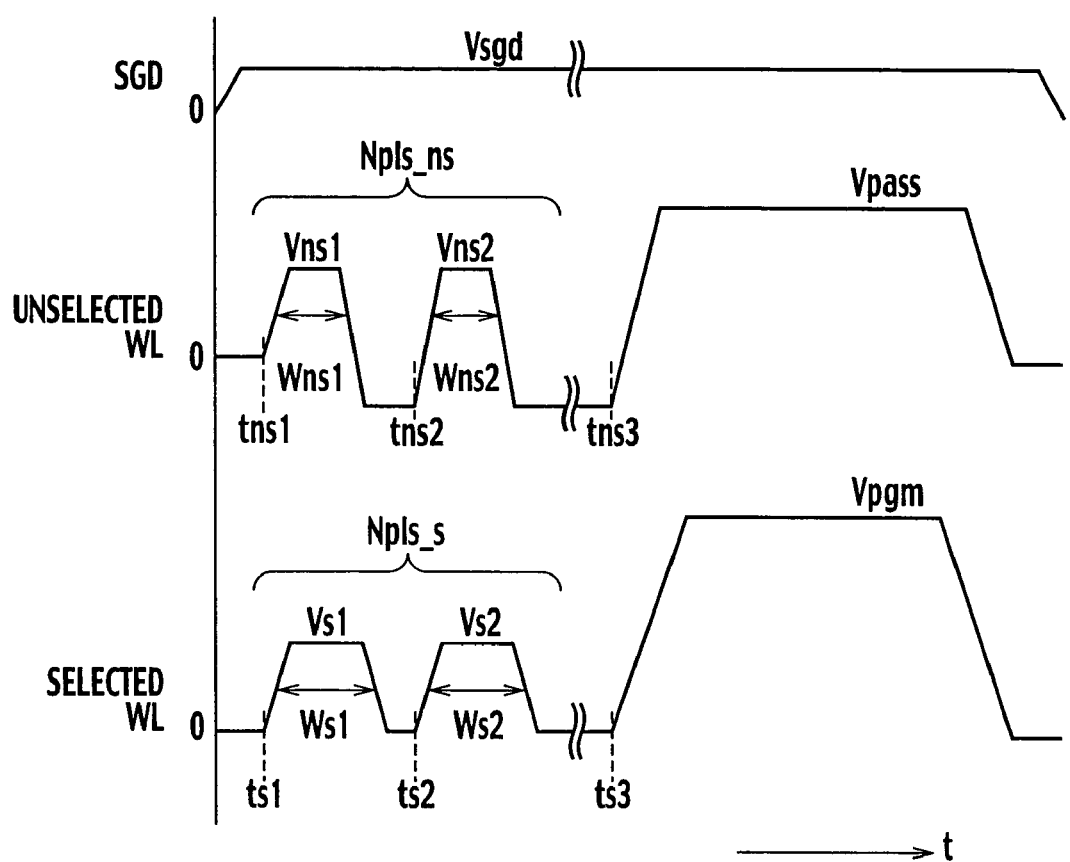
FIG. 21 is a diagram illustrating voltage waveforms during write-in according to a second modified example of the first embodiment of the present invention.

FIG. 21 is a diagram illustrating write-in voltage waveforms used in a second modified example of the first embodiment. A pulse as in the diagram is applied by one write-in to a selected control gate line and an unselected control gate line, respectively. The present modification differs from the first embodiment in that one or more dummy pulses having a minus offset voltage are applied to the unselected control gate line before applying Vpass and Vpgm pulses used for write-in. The number, width, time and peak voltage of the dummy pulses is not particularly limited. For example, a pulse voltage of approximately 4 to 6V, and the number of pulses may be approximately 1 to 3 so as to turn on the written memory transistor.

As shown in FIG. 21, in the state where a voltage Vsgd is applied to the bit line side select gate line SGD, two dummy pulses are applied to the unselected control gate line WL. Pulse widths are Wns1 and Wns2 and pulse height values are Vns1 and Vns2, respectively. An example is given where two dummy pulses are also applied to the selected control gate line WL. Pulse widths are Ws1 and Ws2 and pulse height values are Vs1 and Vs2, respectively. The number of dummy pulses to be applied to the unselected control gate line WL is not limited to two, and the pulse number may be Npls_ns. Similarly, the number of dummy pulses to be applied to the selected control gate line WL is not limited to two, and the pulse number may be Npls_s. The pulse rise times for respective pulses are denoted by tns1, tns2, tns3, ts1, ts2 and ts3. A voltage that is not intended for write-in, namely the time necessary for applying a dummy pulse voltage, may differ for every control gate line. Furthermore, the time Wns1 and Wns2 necessary for applying a voltage not intended for write-in to the unselected control gate lines may be set shorter than the time Ws1 and Ws2 necessary for applying a dummy pulse voltage to the selected control gate lines Namely, the dummy pulse voltage is the voltage that is not intended for write-in to the selected control gate lines.

Furthermore, the time necessary for applying a dummy pulse voltage not intended for the above write-in to an unselected control gate line, which is located further along the bit line side from the selected control gate line, may be set shorter than the time necessary for applying a dummy pulse voltage not intended for the above write-in to the selected control gate line and the unselected control gate line, which is located further along the source line side from the selected control gate line.

(Third Modified Example of the First Embodiment)

Figure 22:
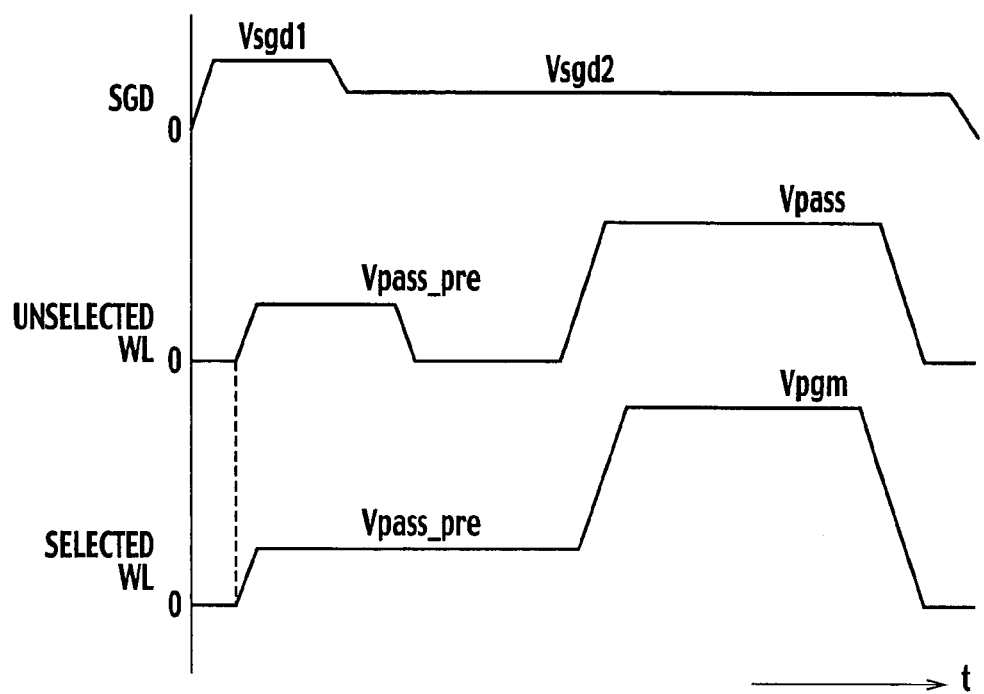
FIG. 22 is a diagram illustrating voltage waveforms during write-in according to a third modified example of the first embodiment of the present invention.

FIG. 22 is a diagram illustrating write-in voltage waveforms used in a third modified example of the first embodiment. A pulse, shown in the diagram, is applied through one write-in to a selected control gate line and an unselected control gate line, respectively. The third modification differs from the fourth comparative example in that one or more dummy pulses having the value of Vpass_pre are applied to unselected control gate line before applying voltage pulses Vpass and Vpgm used for write-in. The number, width, time and peak voltage of the dummy pulses are not particularly limited. For example, a pulse voltage of approximately 4 to 6V, and approximately 1 to 3 pulses may be used so as to turn on the write-in memory transistor.

As shown in FIG. 22, in the state where voltages Vsgd1 and Vsgd2 are applied to the bit line side select gate line SGD, one dummy pulse with a pulse height value of Vpass_pre is applied to the unselected control gate line WL before applying an intermediate voltage Vpass pulse. The voltage Vpass_pre is also applied to the selected control gate line WL. The third modification differs from the fourth comparative example illustrated in FIG. 15 in that one or more dummy pulses having the value of Vpass_pre are applied to the unselected control gate line. Furthermore, the third modification also differs in that once the pulse with the value Vpass_pre is applied, the pulse with the value Vpass_pre is returned to the reference voltage.

(Fourth Modified Example of the First Embodiment)

Figure 23:
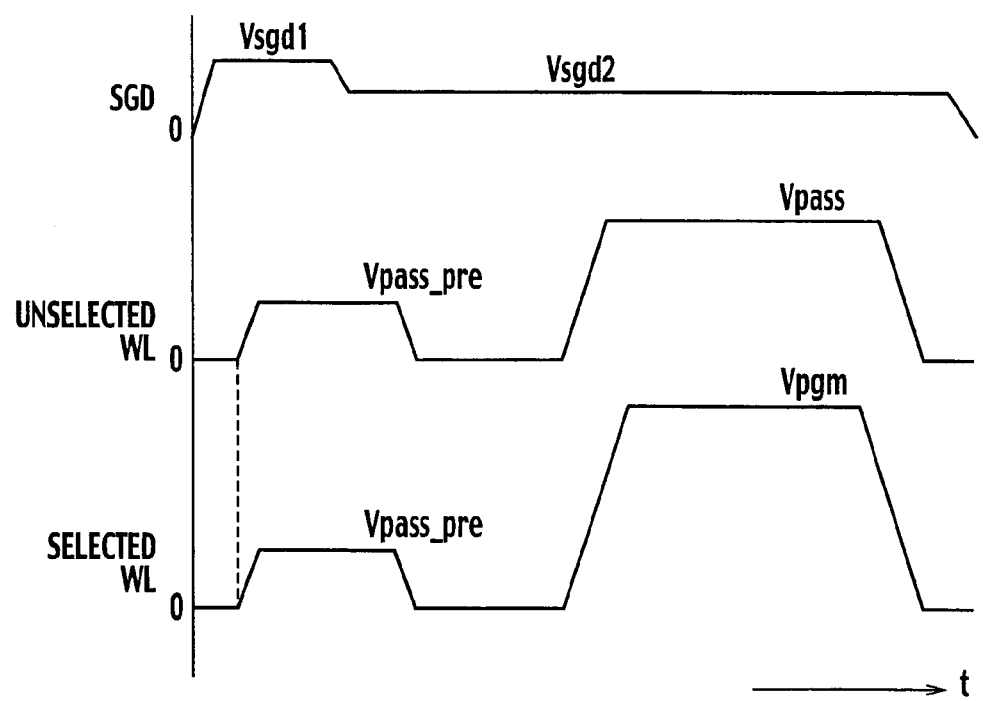
FIG. 23 is a diagram illustrating voltage waveforms during write-in according to a fourth modified example of the first embodiment of the present invention.

FIG. 23 is a diagram illustrating write-in voltage waveforms used in a fourth modified example of the first embodiment. A pulse, shown in the diagram, is applied through one write-in to a selected control gate line and an unselected control gate line, respectively. The fourth modification differs from the fourth comparative example in that one or more dummy pulses having the value of Vpass_pre are applied to the unselected control gate line and the selected gate line before applying the Vpass and Vpgm pulses used for write-in. The number, width, time and peak voltage of the dummy pulses are not particularly limited. For example, a pulse voltage of approximately 4 to 6V, and approximately 1 to 3 pulses may be used so as to turn on the written memory transistor.

As shown in FIG. 23, in the state where voltages Vsgd1 and Vsgd2 are applied to the bit line side select gate line SGD, one dummy pulse with a pulse height value of Vpass_pre is applied to the unselected control gate line WL before applying an intermediate voltage Vpass pulse. The selected control gate line WL also receives a voltage with the pulse height value Vpass_pre. The present modification differs from the fourth comparative example illustrated in FIG. 15 in that one or more dummy pulses having the value of Vpass_pre are applied to the unselected control gate line. Furthermore, the present modification also differs in that once the pulse with the value Vpass_pre is applied, the unselected control gate line is returned to the reference voltage. Furthermore, the present modification differs from the above third modified example in that after application of the pulse voltage with the pulse height value Vpass_pre to be applied to the selected control gate, the pulse height value Vpass_pre is returned to the reference voltage before the write-in voltage Vpgm is applied.

(Fifth Modified Example of the First Embodiment)

Figure 24:
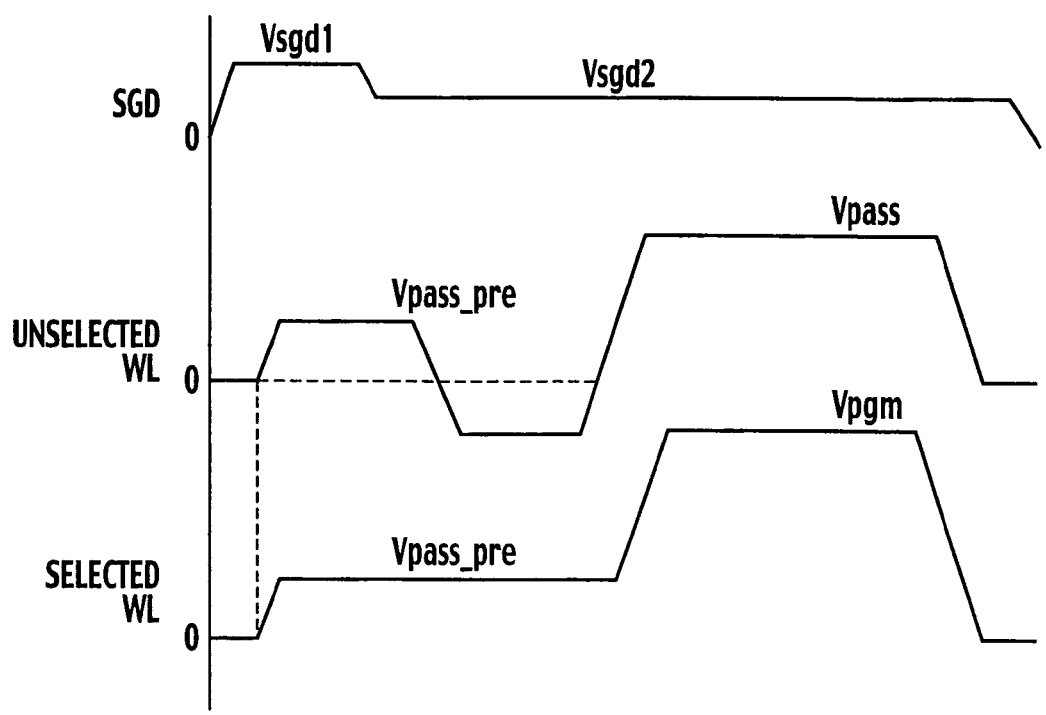
FIG. 24 is a diagram illustrating voltage waveforms during write-in according to a fifth modified example of the first embodiment of the present invention.

FIG. 24 is a diagram illustrating write-in voltage waveforms used in a fifth modified example of the first embodiment. A pulse as in the diagram is applied by one write-in to a selected control gate line and an unselected control gate line, respectively. The fifth modification differs from the fourth comparative example in that one or more dummy pulses having the value of Vpass_pre and a minus offset voltage are applied to the unselected control gate line before applying the voltage pulses Vpass and Vpgm used for write-in. The number, width, time and peak voltage of the dummy pulses are not particularly limited. For example, a pulse voltage of approximately 4 to 6V, and approximately 1 to 3 pulses may be used so as to turn on the written memory transistor.

As shown in FIG. 24, in the state where voltages Vsgd1 and Vsgd2 are applied to the bit line side select gate line SGD, one dummy pulse with a pulse height value of Vpass_pre is applied to the unselected control gate line WL before applying an intermediate voltage Vpass pulse. The selected control gate line WL also receives a voltage with the pulse height value Vpass_pre. The present modification differs from the fourth comparative example illustrated in FIG. 15 in that one or more dummy pulses having the value of Vpass_pre are applied to the unselected control gate line. In addition, the dummy pulse is characterized in that once the pulse with the value Vpass_pre is applied, the dummy voltage is returned to the minus potential rather than the reference voltage of 0V.

(Operation Mode)

Figure 25:
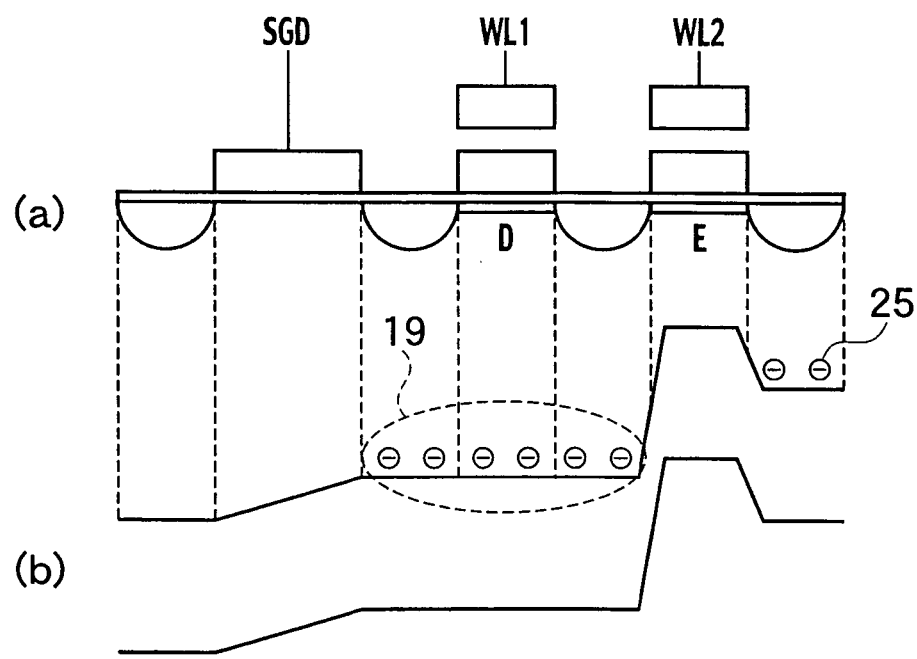
FIG. 25(*a*) is a schematic diagram and (*b*) a band structure schematic diagram illustrating a condition prior to dummy pulse application of a select gate transistor and two subsequent memory cell transistors.
Figure 26:
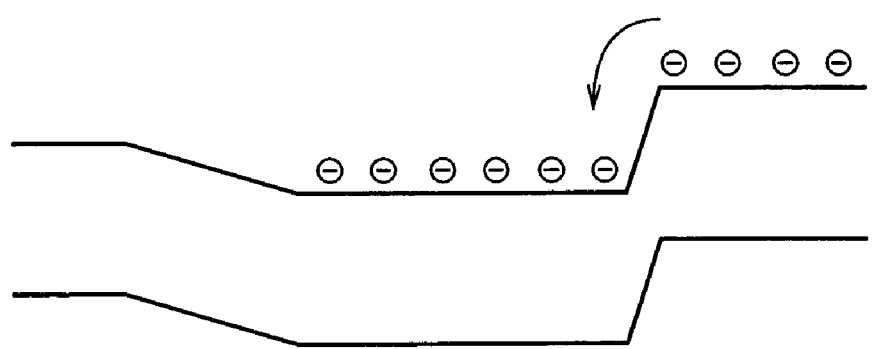
FIG. 26 is a band structure schematic diagram of the vicinity of the surface corresponding to FIG. 25 in each stage during dummy pulse application.
Figure 27:
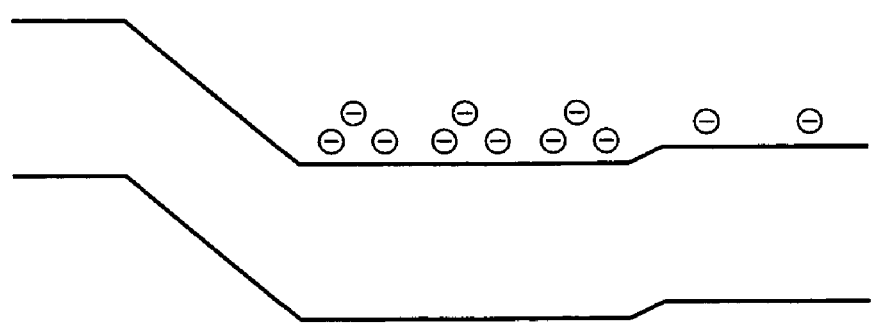
FIG. 27 is a band structure schematic diagram of the vicinity of the surface corresponding to FIG. 25 in each stage during dummy pulse application.
Figure 28:
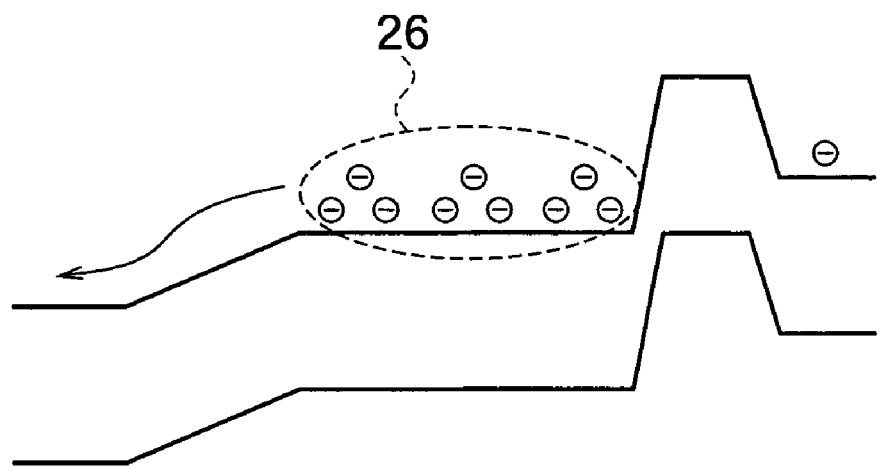
FIG. 28 is a band structure schematic diagram of the vicinity of the surface corresponding to FIG. 25 in each stage during dummy pulse application.
Figure 29:
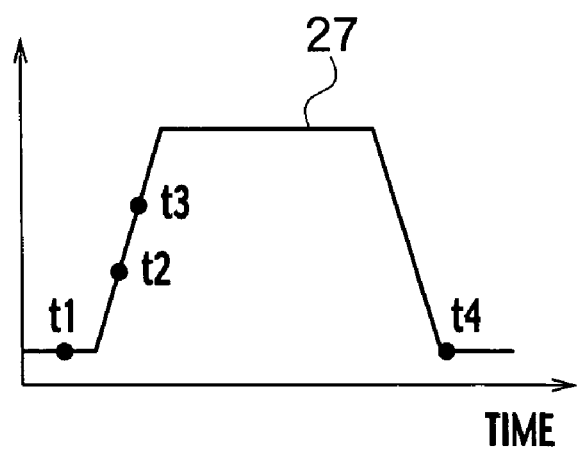
FIG. 29 is a diagram illustrating specific times in the dummy pulse application process for the illustrated band structure.

The effects achieved by the first embodiment of the present invention are described using FIG. 25 to FIG. 28. FIG. 25($b$) to FIG. 28 illustrate an overview of a band structure in the vicinity of the surface in the dummy pulse application process. FIG. 29 represents the times in the application process for a dummy pulse 27 corresponding to FIG. 25($b$) to FIG. 28 to be applied. FIG. 25($b$) represents the state prior to dummy pulse application (time t1 in FIG. 29). In the case of sequential write-in, one or more erased memory cell transistors are normally connected to the bit line side select gate transistor. If the erasure threshold is sufficiently low, the initial voltage is transferred to this erased memory transistor and the channel voltage becomes higher than the written memory transistor. FIG. 25 schematically illustrates the condition of the electrons existing in this channel region. At this time, the concentration of electrons 19 existing in the channel or diffusion layer of the erased memory transistor is given as n_nint. FIG. 26 represents the state immediately prior to turning on the write-in memory transistor in the dummy pulse application process (time t2 in FIG. 29). Here, the electrons are movable through all the memory cell transistors as indicated by the arrow. FIG. 27 represents the state a little after time t2 (time t3 in FIG. 29). It is considered that the electrons move and relocate, where more electrons gathering in the channel of an erased memory transistor having a large plus FG voltage. Accordingly, it is expected that the depletion layer width changes, and the channel voltage difference becomes small or is zero. FIG. 28 represents the state after the dummy pulse has fallen (time t4 in FIG. 29). Optimizing the dummy pulse voltage, width, time or the like in FIG. 19 allows a higher electron concentration n_fin of electrons 26 existing in the channel or diffusion layer of the erased memory transistor at time t4 than the value of n_init prior to dummy pulse application. The excessive electrons are discharged via the select gate transistor in the direction of the arrow, and the value of the electron concentration is once again returned to n_init. Meanwhile, since the diffusion layer of the written memory transistor is not supplied with electrons, the diffusion layer is positively charged. As a result, the charge Qch to be accumulated within the NAND cell unit becomes higher than the value denoted by Equation (6), whereby a channel voltage higher than that achieved by the SB method of the comparative examples which do not apply a dummy pulse can be implemented.

With the nonvolatile semiconductor memory according to the first embodiment, by applying a dummy pulse to the control gate lines before applying the pulses of intermediate voltage Vpass and the write-in voltage Vpgm, the number of electrons existing in the NAND cell unit is reduced and the channel voltage is increased, thereby improving the erroneous write-in characteristics. The nonvolatile semiconductor memory according to the first embodiment of the present invention is extremely versatile and can be used in combination with various channel voltage boosting methods such as the SB method, LSB method, and EASB method. Moreover, temporarily boosting the voltage of the bit line side select gate line SGD allows transfer of the bit line voltage which does not go below the value of the threshold voltage. Even with the bit line side select gate line SGD voltage boosting method, by using the write-in method of the present invention, favorable erroneous write-in characteristics may be achieved since excessive electrons are once again discharged from within the NAND cell unit.

(Second Embodiment)

Figure 30:
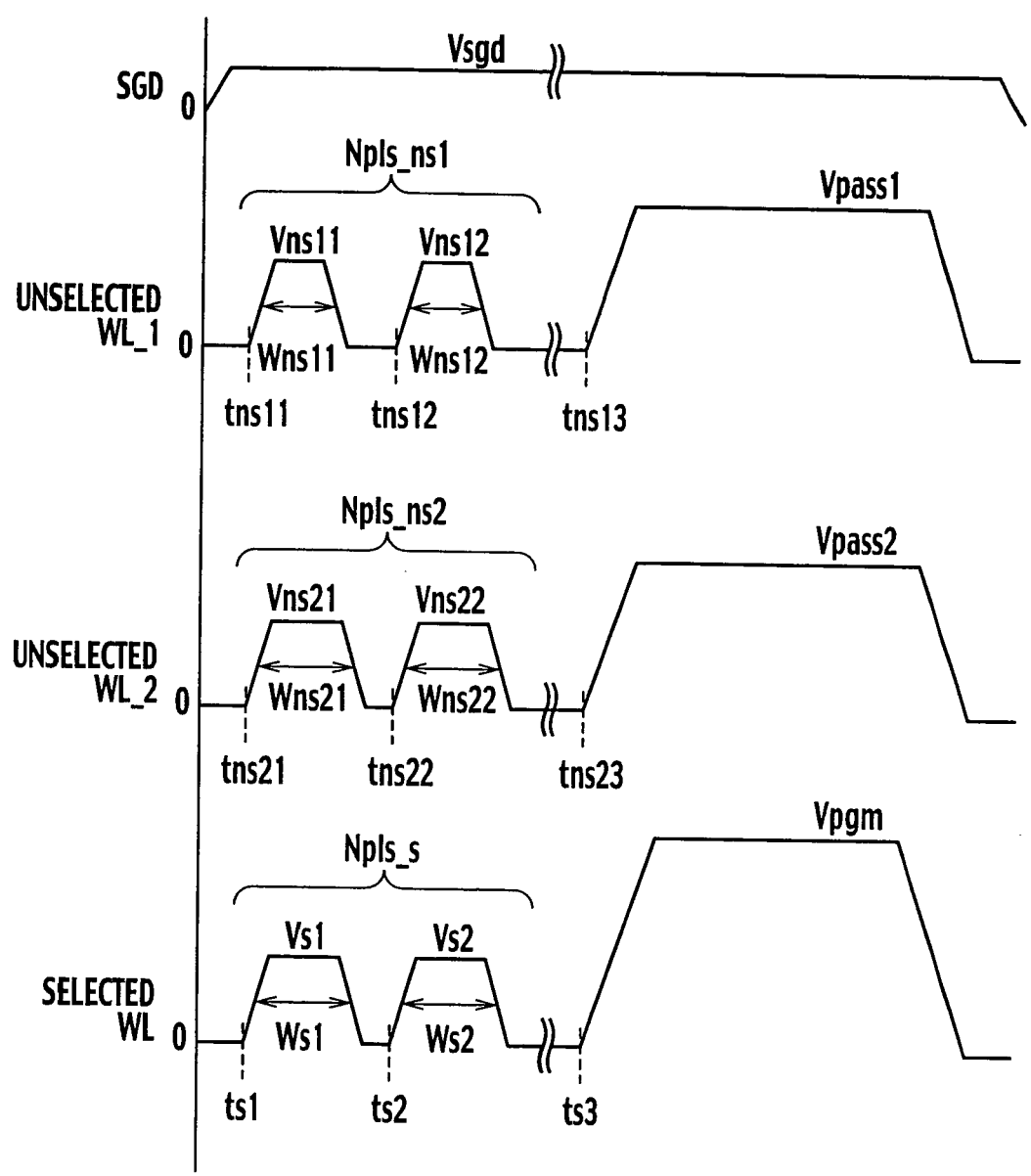
FIG. 30 is a diagram illustrating waveforms of a write-in voltage used in a nonvolatile semiconductor memory according to a second embodiment of the present invention.

FIG. 30 illustrates write-in voltage waveforms used in a nonvolatile semiconductor memory according to a second embodiment of the present invention. Pulses as in the diagram are applied in one write-in operation to a selected control gate line and unselected control gate lines, respectively. The number, width, time and peak voltage of the dummy pulses are not particularly limited. For example, a pulse voltage of approximately 4 to 6V, and approximately 1 to 3 pulses may be used so as to turn on the write-in memory transistor. The second embodiment is different from the first embodiment of the present invention in that there are two types of dummy pulses applied to the unselected control gate lines. For example, the pulse voltage waveforms shown in FIG. 30 are applied to an unselected control gate line WL_1, which is located further along the bit line side than the selected control gate line, and an unselected gate line WL_2, which is located further along the source line side than the selected control gate line, respectively. An objective of the second embodiment is to further increase the effect illustrated in FIG. 25 to FIG. 29 through optimizing the dummy pulse voltage, width, time or the like. Furthermore, a different allocating method for the unselected gate lines may be used.

As shown in FIG. 30, in the state where a voltage pulse with the value Vsgd is applied to the bit line side select gate line SGD, two dummy pulses are applied to the unselected control gate line WL_1, which is located further along the bit line side than the selected control gate line, before applying an intermediate voltage Vpass1. Respective pulse heights are Vns11 and Vns12, pulse widths are Wns11 and Wns12, and the number of pulses may be Npls_ns1 without being limited in number. Similarly, two dummy pulses are applied to the unselected control gate line WL_2, which is located further along the source line side than the selected control gate line, before applying an intermediate voltage Vpass2. Respective pulse heights are Vns21 and Vns22, pulse widths are Wns21 and Wns22, and the number of pulses may be Npls_ns2 without being limited in number. An example is given where two dummy pulses are also applied to the selected control gate line WL. Pulse widths are Ws1 and Ws2 and pulse height values are Vs1 and Vs2, respectively.

The pulse rise times for selected pulses are denoted by tns11, tns12, tns13, tns21, tns22 tns23, ts1, ts2, and ts3. A voltage that is not intended for write-in, namely the time necessary for applying a dummy pulse voltage, may differ for every control gate line. Furthermore, the time (pulse widths) Wns11, Wns12, Wns21 and Wns22 necessary for applying a voltage not intended for write-in to the unselected control gate lines may be set shorter than the time for the voltage that is not intended for write-in, namely the time Ws1 and Ws2 necessary for applying a dummy pulse voltage to the selected control gate line.

Furthermore, the time Wns11 and Wns12 necessary for applying a dummy pulse voltage not intended for the above write-in to the unselected control gate line WL_1, which is located further along the bit line side from the selected control gate line, may be set shorter than the time Wns21 and Wns22 necessary for applying a dummy pulse voltage not intended for the above write-in to the selected control gate line and the unselected control gate line WL_2, which is located further along the source line side from the selected control gate line.

With the nonvolatile semiconductor memory according to the second embodiment, by applying a dummy pulse to the control gate lines before applying the pulses of intermediate voltage Vpass and the write-in voltage Vpgm, the number of electrons existing in the NAND cell unit is reduced and the channel voltage is increased, thereby improving the erroneous write-in characteristics. The nonvolatile semiconductor memory according to the second embodiment of the present invention is extremely versatile and can use in combination various channel voltage boosting methods such as the SB method, LSB method, and EASB method. Moreover, temporarily boosting the voltage of the bit line side select gate line SGD allows transfer of the bit line voltage which does not go below the value of the threshold voltage. Even with the bit line side select gate line SGD voltage boosting method, by using the write-in method of the present invention, favorable erroneous write-in characteristics may be achieved since excessive electrons are once again discharged from within the NAND cell unit.

(Third Embodiment)

Figure 31:
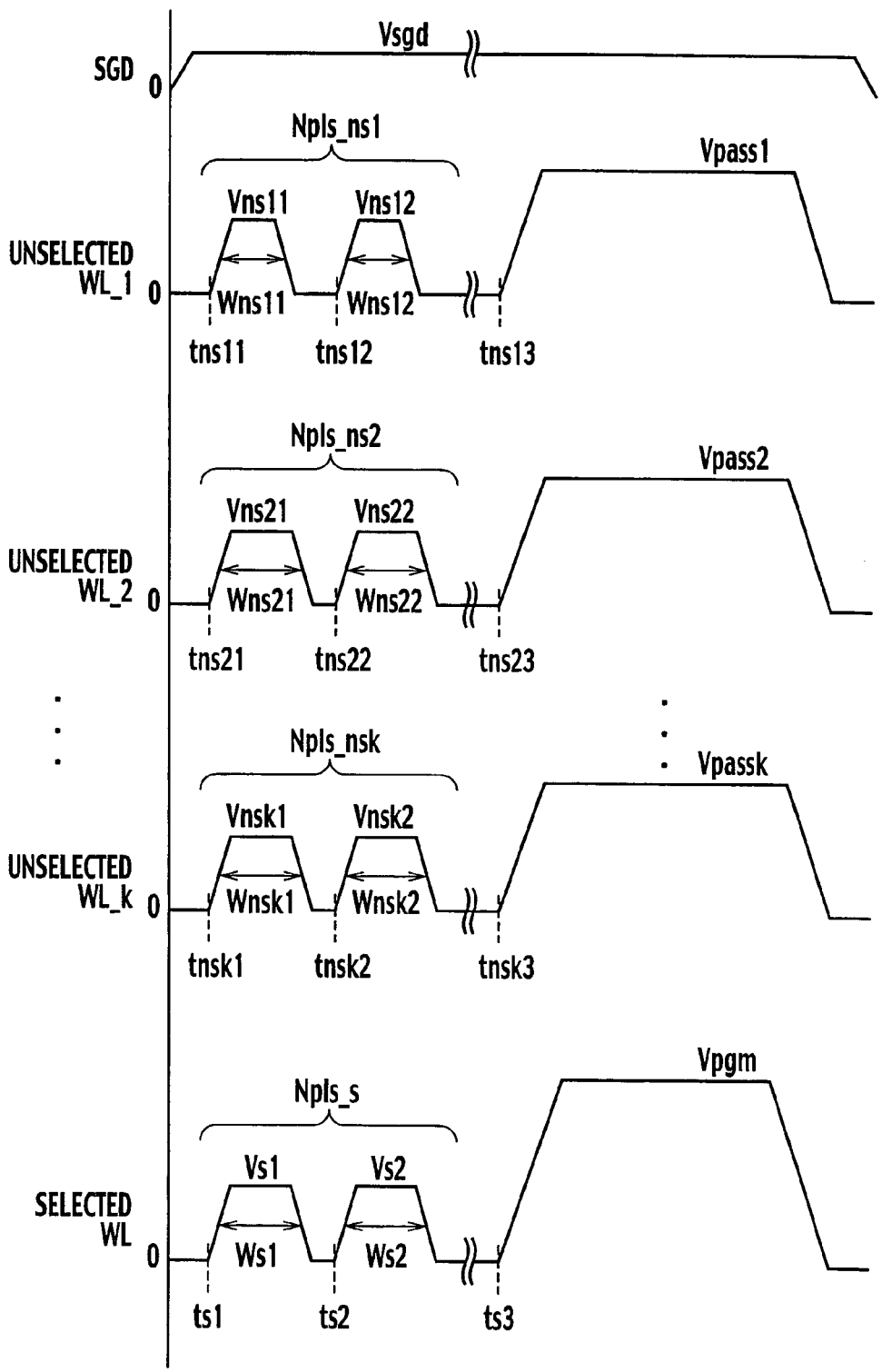
FIG. 31 is a diagram illustrating waveforms of a write-in voltage used in a nonvolatile semiconductor memory according to a third embodiment of the present invention.

FIG. 31 illustrates write-in voltage waveforms used in a nonvolatile semiconductor memory according to a third embodiment of the present invention. Pulses as in FIG. 31 are applied by one write-in operation to a selected control gate line and unselected control gate lines, respectively. The number, width, time and peak voltage of the dummy pulses are not particularly limited. For example, a pulse voltage of approximately 4 to 6V, and approximately 1 to 3 pulses may be used so as to turn on the write-in memory transistor. The third embodiment is different from the first and the second embodiment in that the types of dummy pulses applied to the unselected control gate lines is increased to k(k<n), with an aim to achieve even greater effects. For example, shortening the pulse width as the control gate line approaches the source line may be considered. Furthermore, a different allocating method for the unselected gate lines may be used.

As shown in FIG. 31, in the state where a voltage pulse with the value Vsgd is applied to the bit line side select gate line SGD, two dummy pulses are applied to the unselected control gate line WL_1 before applying an intermediate voltage Vpass1. Respective pulse heights are Vns11 and Vns12, pulse widths are Wns11 and Wns12, and the number of pulses may be Npls_ns1 without being limited in number. Similarly, two dummy pulses are applied to the unselected control gate line WL_2 before applying an intermediate voltage Vpass2. Respective pulse heights are Vns21 and Vns22, pulse widths are Wns21 and Wns22, and the number of pulses may be Npls_ns2 without being limited in number. Similarly, two dummy pulses are applied to an unselected control gate line WL_k before applying an intermediate voltage Vpassk. Respective pulse heights are Vnsk1 and Vnsk2 pulse widths are Wnsk1 and Wnsk2, and the number of pulses may be Npls_nsk without being limited in number. An example is given where two dummy pulses are also applied to the selected control gate line WL. Pulse widths are Ws1 and Ws2 and pulse height values are Vs1 and Vs2, respectively.

The pulse rise times for respective pulses are denoted by tns11, tns12, tns13, tns21, tns22, tns23, tnsk1, tnsk2, tnsk3, ts1, ts2 and ts3. A voltage that is not intended for write-in, namely the time necessary for applying a dummy pulse voltage, may differ for every control gate line. Furthermore, the time Wns11, Wns12, Wns21, Wns22, . . . , Wnsk1 and Wnsk2 necessary for applying a voltage not intended for write-in to the unselected control gate lines may be set shorter than the voltage that is not intended for write-in, namely the time (pulse width) Ws1 and Ws2 necessary for applying a dummy pulse voltage to the selected control gate line.

Furthermore, the present embodiment is also similar in that the time necessary for applying a dummy pulse voltage not intended for the above write-in to an unselected control gate line, which is located further along the bit line side from the selected control gate line, may be set shorter than the time necessary for applying a dummy pulse voltage not intended for the above write-in to the selected control gate line and the unselected control gate line, which is located further along the source line side from the selected control gate line.

With the nonvolatile semiconductor memory according to the third embodiment, by applying a dummy pulse to the control gate lines before applying the pulses of intermediate voltage Vpass and the write-in voltage Vpgm, the number of electrons in the NAND cell unit is reduced and the channel voltage is increased, thereby improving the erroneous write-in characteristics. The nonvolatile semiconductor memory according to the third embodiment of the present invention is extremely versatile and can be used in combination with various channel voltage boosting methods such as the SB method, LSB method, and EASB method. Moreover, temporarily boosting the voltage of the bit line side select gate line SGD allows transfer of the bit line voltage which does not go below the value of the threshold voltage. Even with the bit line side select gate line SGD voltage boosting method, by using the write-in method of the present invention, favorable erroneous write-in characteristics may be achieved since excessive electrons are once again discharged from within the NAND cell unit.

(Fourth Embodiment)

In a fourth embodiment of the present invention, the cases of applying the write-in method characteristic of the nonvolatile semiconductor memory according to the embodiments of the present invention are generalized for the LSB method, EASB method or another channel voltage boosting method that utilizes memory cell transistor cutoff.

Figure 32:
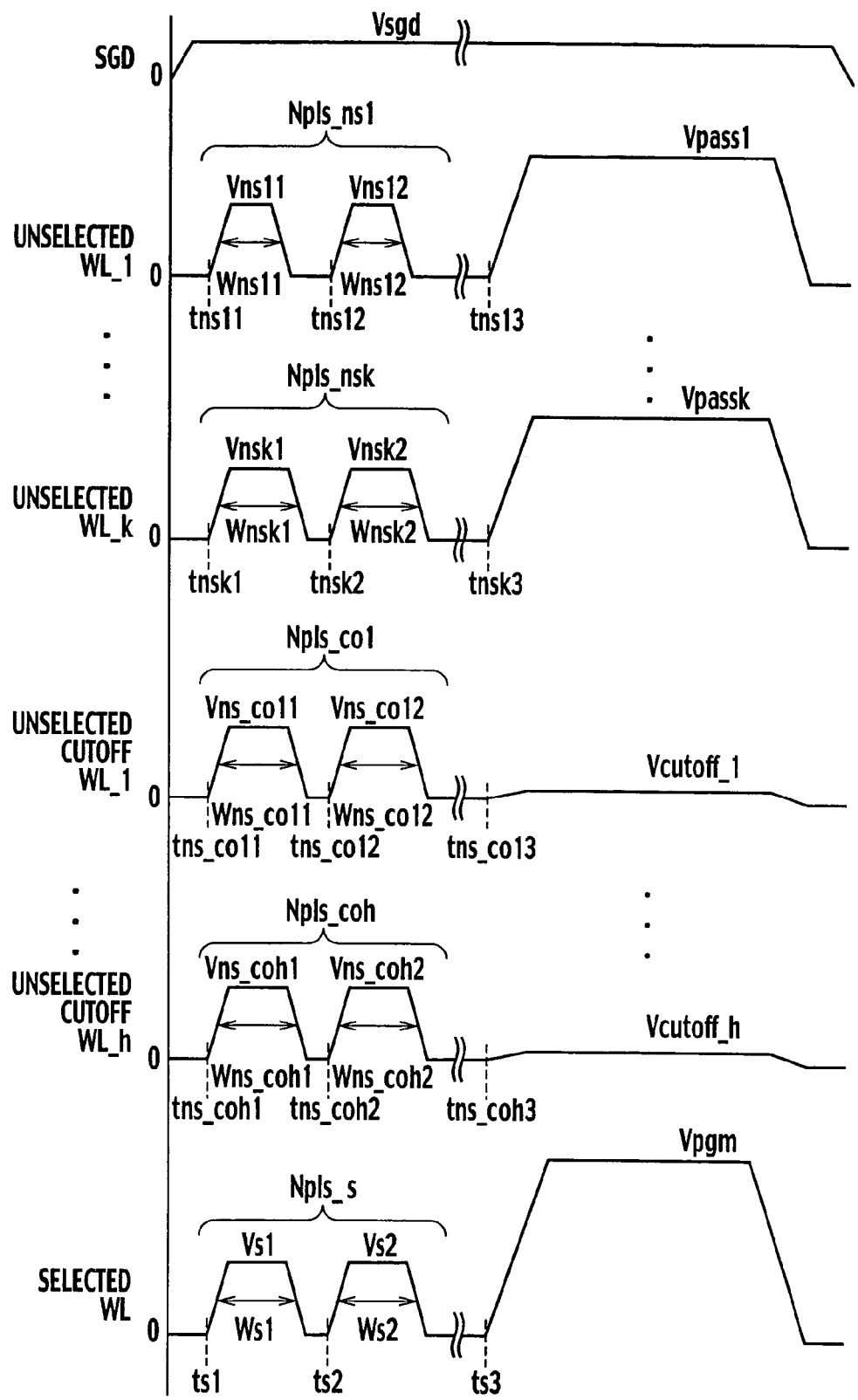
FIG. 32 is a diagram illustrating waveforms of a write-in voltage used in a nonvolatile semiconductor memory according to a fourth embodiment of the present invention.

FIG. 32 illustrates write-in voltage waveforms used in a nonvolatile semiconductor memory according to the fourth embodiment of the present invention. Pulses as in FIG. 32 are applied by one write-in operation to a selected control gate line and unselected control gate lines, respectively. The number, width, time and peak voltage of the dummy pulses are not particularly limited. For example, a pulse voltage of approximately 4 to 6V, and approximately 1 to 3 pulses may be used so as to turn on the write-in memory transistor. In the fourth embodiment, k types (k<n) of voltage waveforms for the unselected control gate lines to which Vpass is applied are used, and h types of voltage waveforms for the unselected control gate lines that cut off the memory cell transistors are used. For example, 0V is applied as the cutoff voltage Vcutoff.

As shown in FIG. 32, in the state where a voltage pulse with the value Vsgd is applied to the bit line side select gate line SGD, two dummy pulses are applied to the unselected control gate line WL_1 before applying an intermediate voltage Vpass1. Respective pulse heights are Vns11 and Vns12, pulse widths are Wns11 and Wns12, and the number of pulses may be Npls_ns1 without being limited in number. Similarly, two dummy pulses are applied to the unselected control gate line WL_2 before applying an intermediate voltage Vpass2. Respective pulse heights are Vns21 and Vns22, pulse widths are Wns21 and Wns22, and the number of pulses may be Npls_ns2 without being limited in number. Similarly, two dummy pulses are applied to an unselected control gate line WL_k before applying an intermediate voltage Vpassk. Respective pulse heights are Vnsk1 and Vnsk2, pulse widths are Wnsk1 and Wnsk2, and the number of pulses may be Npls_nsk without being limited in number. An example is given where two dummy pulses are also applied to the selected control gate line WL. Pulse widths are Ws1 and Ws2 and pulse height values are Vs1 and Vs2, respectively.

The pulse rise times for respective pulses are denoted by tns11, tns12, tns13, tns21, tns22, tns23, tnsk1, tnsk2, tnsk3, ts1, ts2 and ts3. A voltage that is not intended for write-in, namely the time necessary for applying a dummy pulse voltage, may differ for every control gate line. Furthermore, the time (pulse widths) Wns11, Wns12, Wns21, Wns22, ..., Wnsk1 and Wnsk2 necessary for applying a voltage not intended for write-in to the unselected control gate lines may be set shorter than the voltage that is not intended for write-in, namely the time (pulse widths) Ws1 and Ws2 necessary for applying a dummy pulse voltage to the selected control gate line.

Furthermore, the fourth embodiment is also similar in that the time necessary for applying a dummy pulse voltage not intended for the above write-in to unselected control gate line, which is located further along the bit line side from the selected control gate line, may be set shorter than the time necessary for applying a dummy pulse voltage not intended for the above write-in to the selected control gate line and the unselected control gate line, which is located further along the source line side from the selected control gate line.

Moreover, using h types of voltage waveforms for the unselected control gate lines that cutoff the memory transistor is characteristic of the fourth embodiment. As shown in FIG. 32, in the state where a voltage pulse with the value Vsgd is applied to the bit line side select gate line SGD, two dummy pulses are applied to the unselected control gate line WL_1, which cuts off the memory transistor, before applying a cutoff voltage Vcutoff_1. Respective pulse heights are Vns_co11 and Vns_co12, pulse widths are Wns_co11 and Wns_co12, and the number of pulses may be Npls_col without being limited in number. Similarly, two dummy pulses are applied to an unselected control gate line WL_h, which cuts off the memory transistor, before applying a cutoff voltage Vcutoff_h. Respective pulse heights are Vns_coh1 and Vns_coh2, pulse widths are Wns_coh1 and Wns_coh2, and the number of pulses may be Npls_coh without being limited in number. The pulse rise times for respective pulses are denoted by tns_co11, tns_co12, tns_co13, tns_coh1, tns_coh2 and tns_coh3.

With the nonvolatile semiconductor memory according to the fourth embodiment, by applying a dummy pulse to the control gate lines before applying the pulses of intermediate voltage Vpass and the write-in voltage Vpgm, the number of electrons in the NAND cell unit is reduced and the channel voltage is increased, thereby improving the erroneous write-in characteristics. The nonvolatile semiconductor memory according to the fourth embodiment of the present invention is extremely versatile and can be used in combination with various channel voltage boosting methods such as the SB method, LSB method, and EASB method. Moreover, temporarily boosting the voltage of the bit line side select gate line SGD allows transfer of the bit line voltage, which does not go below the value of the threshold voltage. Even with the bit line side select gate line SGD voltage boosting method, by using the write-in method of the present invention, favorable erroneous write-in characteristics may be achieved since excessive electrons are discharged from within the NAND cell unit.

(Fifth Embodiment)

Figure 33:
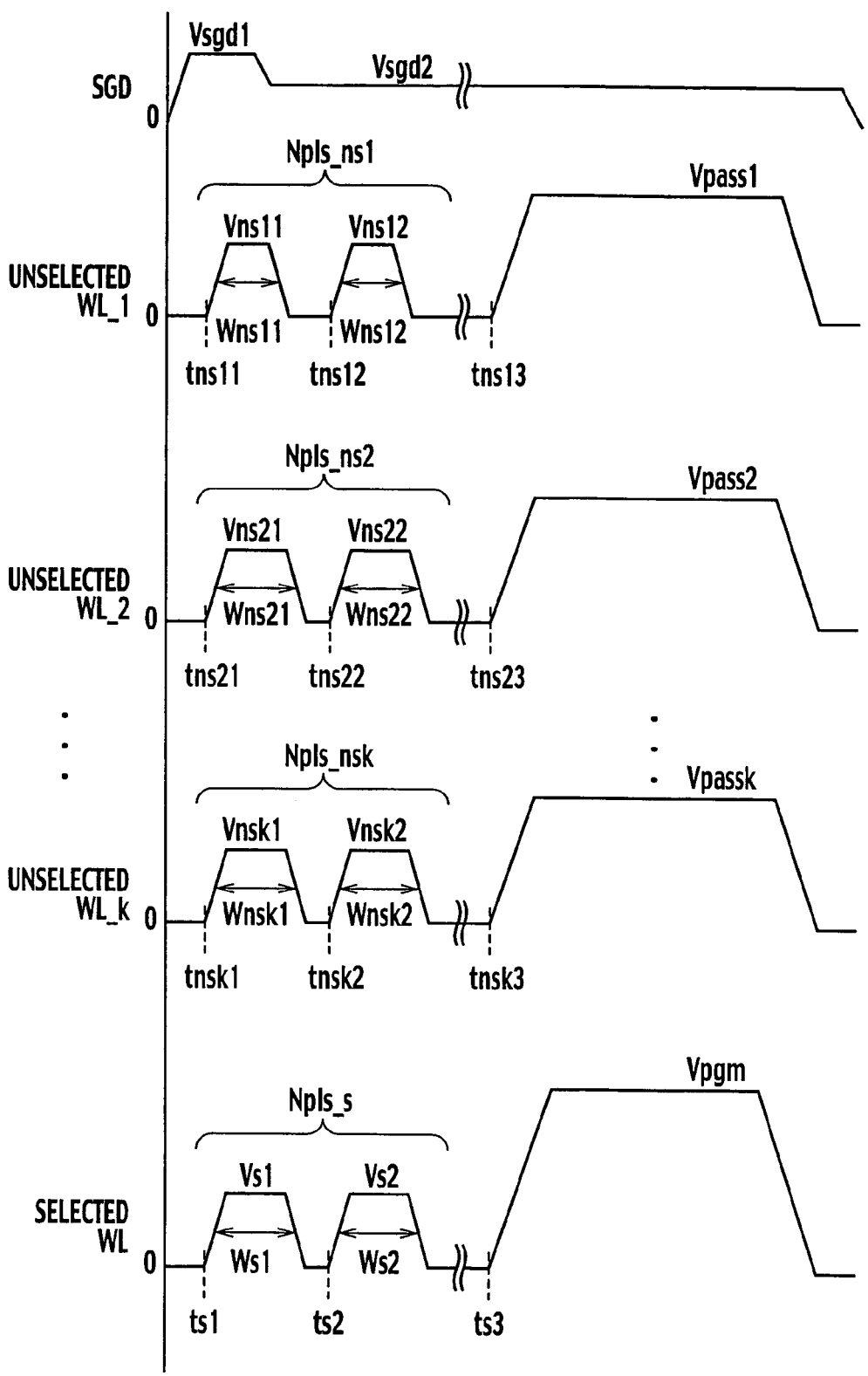
FIG. 33 is a diagram illustrating waveforms of a write-in voltage used in a nonvolatile semiconductor memory according to a fifth embodiment of the present invention.

FIG. 33 illustrates write-in voltage waveforms used in a nonvolatile semiconductor memory according to a fifth embodiment of the present invention.

Pulses as in FIG. 33 are applied by one write-in operation to a selected control gate line and unselected control gate lines, respectively. The number, width, time and peak voltage of the dummy pulses are not particularly limited. For example, a pulse voltage of approximately 4 to 6V, and approximately 1 to 3 pulses may be used so as to turn on the write-in memory transistor. Waveforms for the unselected control gate lines to which Vpass is applied are used may be of k types. In addition temporarily boosting the voltage of the selected gate line to Vsgd1 allows transfer of the bit line voltage in the bit line side select gate transistor, which does not go below the value of the threshold voltage.

In the fourth comparative example, multiple electrons are introduced into the NAND cell unit during Vsgd1 application when the voltages applied to the memory transistor control gate lines are too large, however, since excessive electrons are again discharged from within the NAND cell unit by applying the write-in method according to the fifth embodiment of the present invention, favorable erroneous write-in characteristics may be obtained.

As shown in FIG. 33, in the state where pulses of voltages Vsgd1 and Vsgd2 are applied to the bit line side select gate line SGD, two dummy pulses are applied to the unselected control gate line WL_1 before applying an intermediate voltage Vpass1. Respective pulse heights are Vns11 and Vns12, pulse widths are Wns11 and Wns12, and the number of pulses may be Npls_ns1 without being limited in number. Similarly, two dummy pulses are applied to the unselected control gate line WL_2 before applying an intermediate voltage Vpass2. Respective pulse heights are Vns21 and Vns22, pulse widths are Wns21 and Wns22, and the number of pulses may be Npls_ns2 without being limited in number. Similarly, two dummy pulses are applied to an unselected control gate line WL_k before applying an intermediate voltage Vpassk. Respective pulse heights are Vnsk1 and Vnsk2, pulse widths are Wnsk1 and Wnsk2, and the number of pulses may be Npls_nsk without being limited in number. An example is given where two dummy pulses are also applied to the selected control gate line WL. Pulse widths are Ws1 and Ws2 and pulse height values are Vs1 and Vs2, respectively.

The pulse rise times for respective pulses are denoted tns11, tns12, tns13, tsn21, tsn22, tsn23, tnsk1, tnsk2, tnsk3, ts1, ts2 and ts3. A voltage that is not intended for write-in, namely the time necessary for applying a dummy pulse voltage, may differ for every control gate line. Furthermore, the time Wns11, Wns12, Wns21, Wns22, . . . , Wnsk1 and Wnsk2 necessary for applying a voltage not intended for write-in to the unselected control gate lines may be set shorter than the voltage that is not intended for write-in, namely the time (pulse width) Ws1 and Ws2 necessary for applying a dummy pulse voltage to the selected control gate line.

Furthermore, the fifth embodiment is also similar in that the time necessary for applying a dummy pulse voltage not intended for the above write-in to an unselected control gate line, which is located further along the bit line side from the selected control gate line, may be set shorter than the time necessary for applying a dummy pulse voltage not intended for the above write-in to the selected control gate line and the unselected control gate line, which is located further along the source line side from the selected control gate line.

With the nonvolatile semiconductor memory according to the fifth embodiment, by applying a dummy pulse to the control gate lines before applying the pulses of intermediate voltage Vpass and the write-in voltage Vpgm, the number of electrons in the NAND cell unit is reduced and the channel voltage is increased, thereby improving the erroneous write-in characteristics. The nonvolatile semiconductor memory according to the fifth embodiment of the present invention is extremely versatile and can be used in combination with various channel voltage boosting methods such as the SB method, LSB method, and EASB method. Moreover, temporarily boosting the voltage of the bit line side select gate line SGD allows transfer of the bit line voltage which does not go below the value of the threshold voltage. Even with the bit line side select gate line SGD voltage boosting method, by using the write-in method of the present invention, favorable erroneous write-in characteristics may be achieved since excessive electrons are again discharged from within the NAND cell unit.

(Sixth Embodiment)

Figure 34:
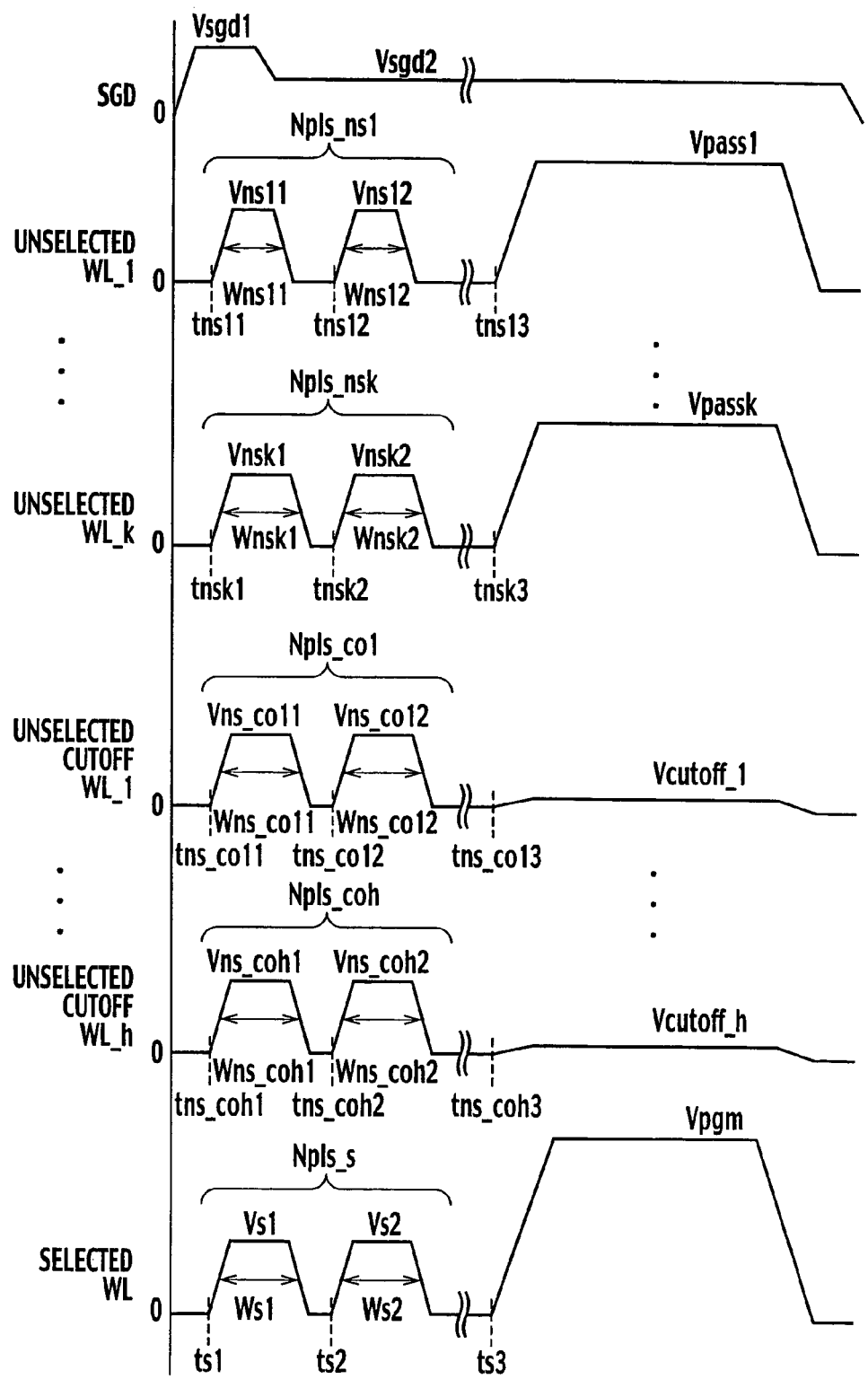
FIG. 34 is a diagram illustrating waveforms of a write-in voltage used in a nonvolatile semiconductor memory according to a sixth embodiment of the present invention.

FIG. 34 illustrates write-in voltage waveforms used in a nonvolatile semiconductor memory according to a sixth embodiment of the present invention.

Pulses as in FIG. 34 are applied by one write-in operation to a selected control gate line and unselected control gate lines, respectively. The number, width, time and peak voltage of the dummy pulses are not particularly limited. For example, a pulse voltage of approximately 4 to 6V, and approximately 1 to 3 pulses may be used so as to turn on the write-in memory transistor. K types (k<n) Voltage waveforms of K types (k<n) for the unselected control gate lines to which Vpass is applied are used, and h types of voltage waveforms for the unselected control gate lines that cutoff the memory cell transistors are used. In addition, temporarily boosting the voltage of the selected gate line to Vsgd1 allows transfer of the bit line voltage in the bit line side select gate transistor, which does not go below the value of the threshold voltage.

In the fourth comparative example, excessive electrons are introduced into the NAND cell unit during Vsgd1 application when the voltages applied to the memory transistor control gate lines are too large, however, since excessive electrons are again discharged from within the NAND cell unit by applying the write-in method according to the sixth embodiment of the present invention, favorable erroneous write-in characteristics may be achieved.

As shown in FIG. 34, in the state where pulses of voltages Vsgd1 and Vsgd2 are applied to the bit line side select gate line SGD, two dummy pulses are applied to the unselected control gate line WL_1 before applying an intermediate voltage Vpass1. Respective pulse heights are Vns11 and Vns12, pulse widths are Wns11 and Wns12, and the number of pulses may be Npls_ns1 without being limited in number. Similarly, two dummy pulses are applied to the unselected control gate line WL_2 before applying an intermediate voltage Vpass2. Respective pulse heights are Vns21 and Vns22, pulse widths are Wns21 and Wns22, and the number of pulses may be Npls_ns2 without being limited in number. Similarly, two dummy pulses are applied to an unselected control gate line WL_k before applying an intermediate voltage Vpassk. Respective pulse heights are Vnsk1 and Vnsk2, pulse widths are Wnsk1 and Wnsk2, and the number of pulses may be Npls_nsk without being limited in number. An example is given where two dummy pulses are also applied to the selected control gate line WL. Pulse widths are Ws1 and Ws2 and pulse height values are Vs1 and Vs2, respectively.

The pulse rise times for respective pulses are denoted by tns11, tns12, tns13, tnsk1, tnsk2, tnsk3, ts1, ts2, and ts3. A voltage that is not intended for write-in, namely the time necessary for applying a dummy pulse voltage, may differ for every control gate line. Furthermore, the time (pulse width) Wns11, Wns12, Wnsk1 and Wnsk2 necessary for applying a voltage not intended for write-in to the unselected control gate lines may be set shorter than the voltage that is not intended for write-in, namely the time (pulse width) Ws1 and Ws2 necessary for applying a dummy pulse voltage to the selected control gate line.

Furthermore, the sixth embodiment is also similar in that the time necessary for applying a dummy pulse voltage not intended for the above write-in to an unselected control gate line, which is located further along the bit line side from the selected control gate line, may be set shorter than the time necessary for applying a dummy pulse voltage not intended for the above write-in to the selected control gate line and the unselected control gate line, which is located further along the source line side from the selected control gate line.

Moreover, using h types of voltage waveforms for the unselected control gate lines that cutoff the memory transistor is a characteristic of the sixth embodiment. As shown in FIG. 34, in the state where voltage pulses with the values Vsgd1 and Vsgd2 are applied to the bit line side select gate line SGD, two dummy pulses are applied to the unselected control gate line WL_1, which cuts off the memory transistor, before applying a cutoff voltage Vcutoff_1. Respective pulse heights are Vns_co11 and Vns_co12, pulse widths are Wns_co11 and Wns_co12, and the number of pulses may be Npls_col without being limited in number. Similarly, two dummy pulses are applied to an unselected control gate line WL_h, which cuts off the memory transistor, before applying a cutoff voltage Vcutoff_h. Respective pulse heights are Vns_coh1 and Vns_coh2, pulse widths are Wns_coh1 and Wns_coh2, and the number of pulses may be Npls_coh without being limited in number. The pulse rise times for respective pulses are denoted by tns_co11, tns_co12, tns_co13, tns_coh1, tns_coh2 and tns_coh3.

With the nonvolatile semiconductor memory according to the sixth embodiment, by applying a dummy pulse to the control gate lines before applying the pulses of intermediate voltage Vpass and the write-in voltage Vpgm, the number of electrons in the NAND cell unit is reduced and the channel voltage is increased, thereby improving the erroneous write-in characteristics. The nonvolatile semiconductor memory according to the sixth embodiment of the present invention is extremely versatile and can be used in combination with various channel voltage boosting methods such as the SB method, LSB method, and EASB method. Moreover, temporarily boosting the voltage of the bit line side select gate line SGD allows transfer of the bit line voltage which does not go below the value of the threshold voltage. Even with the bit line side select gate line SGD voltage boosting method, by using the write-in method of the present invention, favorable erroneous write-in characteristics may be achieved since excessive electrons are again discharged from within the NAND cell unit.

(Seventh Embodiment)

Figure 35:
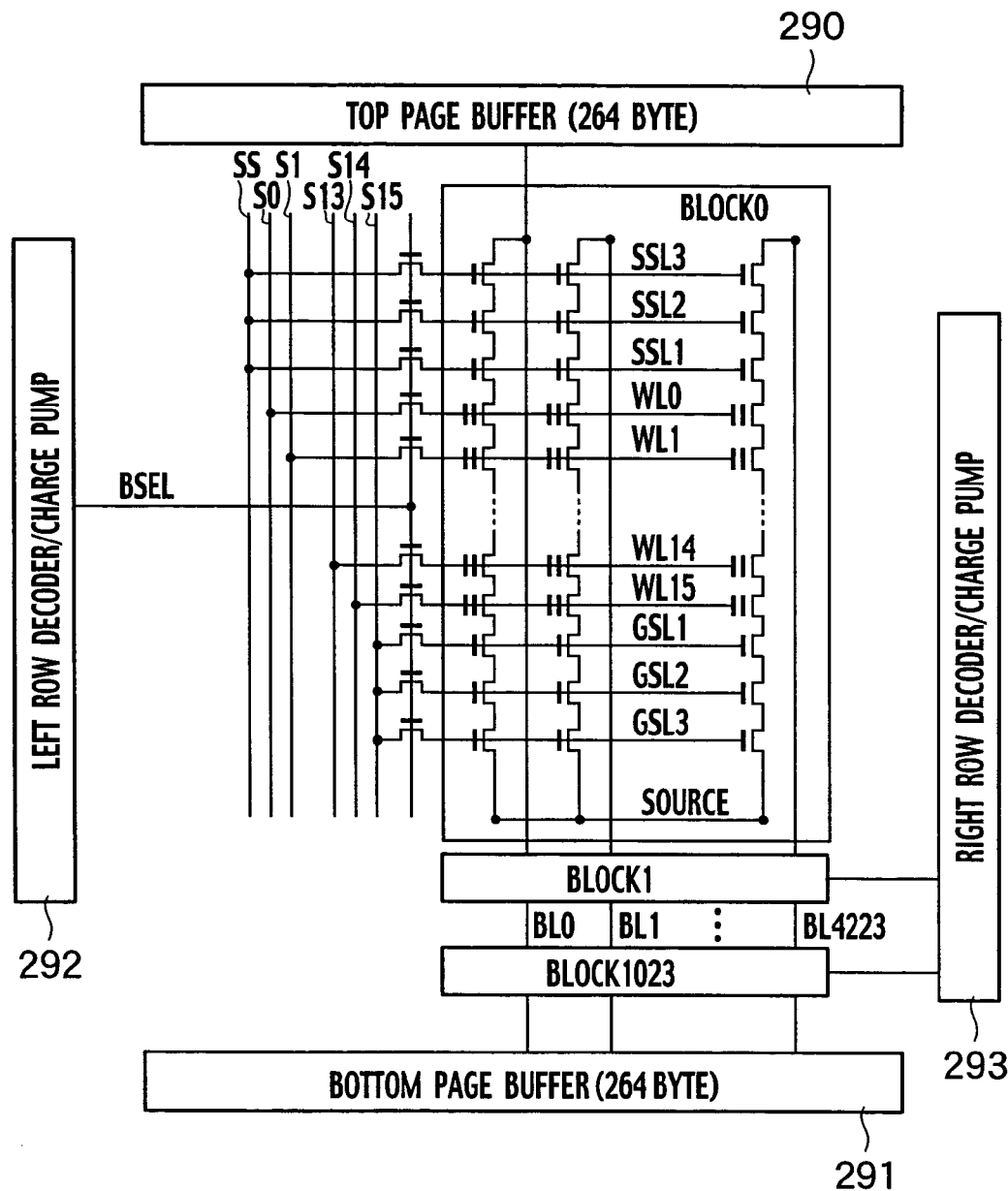
FIG. 35 is a schematic circuit diagram of a nonvolatile semiconductor memory configured with 64 M-bit NAND flash memory according to a seventh embodiment of the present invention.

FIG. 35 is an illustrative circuit diagram of a nonvolatile semiconductor memory configured with 64 -M bit NAND flash memory according to a seventh embodiment of the present invention. There is an important feature in using the write-in voltage methods for the nonvolatile semiconductor memory described in the first to sixth embodiments of the present invention. As shown in FIG. 35, the bit line side select gate is divided into three bit line side select gate lines SSL1, SSL2, and SSL3. In addition, the source line side select gate is also divided into three source line side select gate lines GSL1, GSL2, and GSL3. Separate signals may be sent from a select gate control circuit to the select gates. Alternatively, the select gates may be short circuited at a predetermined pitch, and a technique to reduce the delay of signals propagated on the select gate line may be employed. In the exemplary circuit of FIG. 35, a technique is employed to supply the same electric potential through the operation of the row select gate transistor. In FIG. 35, block 0 through block 1023 configured with NAND memory cell arrays are arranged, and a top page buffer 290, a bottom page buffer 291, a left row decoder/charge pump 292, and a right row decoder/charge pump 293 are arranged there around. In addition, in FIG. 35, word lines WL0 through WL 15 are arranged parallel to the bit line side select gate lines SSL1, SSL2 and SSL3, and the source line side select gate lines GSL1, GSL2 and GSL3, and bit lines BL0 through BL4223 are arranged perpendicular to these word lines. A feature of FIG. 35 is the fact that the bit line side select gate lines SSL1, SSL2 and SSL3 and the source line side select gate lines GSL1, GSL2 and GSL3 are short-circuited.

With the nonvolatile semiconductor memory according to the seventh embodiment, by applying a dummy pulse to the control gate lines before applying the pulses of intermediate voltage Vpass and the write-in voltage Vpgm, the number of electrons in the NAND cell unit is reduced and the channel voltage is increased, thereby improving the erroneous write-in characteristics. The nonvolatile semiconductor memory according to the seventh embodiment of the present invention is extremely versatile and can be used in combination with various channel voltage boosting methods such as the SB method, LSB method, and EASB method. Moreover, temporarily boosting the voltage of the bit line side select gate lines SSL1, SSL2 and SSL3 allows transfer of the bit line voltage, which does not go below the value of the threshold voltage. By using the write-in method of the present invention, favorable erroneous write-in characteristics may be achieved since excessive electrons are again discharged from within the NAND cell unit.

(Eighth Embodiment)

Roughly classified, there are three operation modes of a nonvolatile semiconductor memory according to an embodiment of the present invention. The three operating modes are called "page mode", "byte mode", and "ROM region included EEPROM mode".

Figure 36:
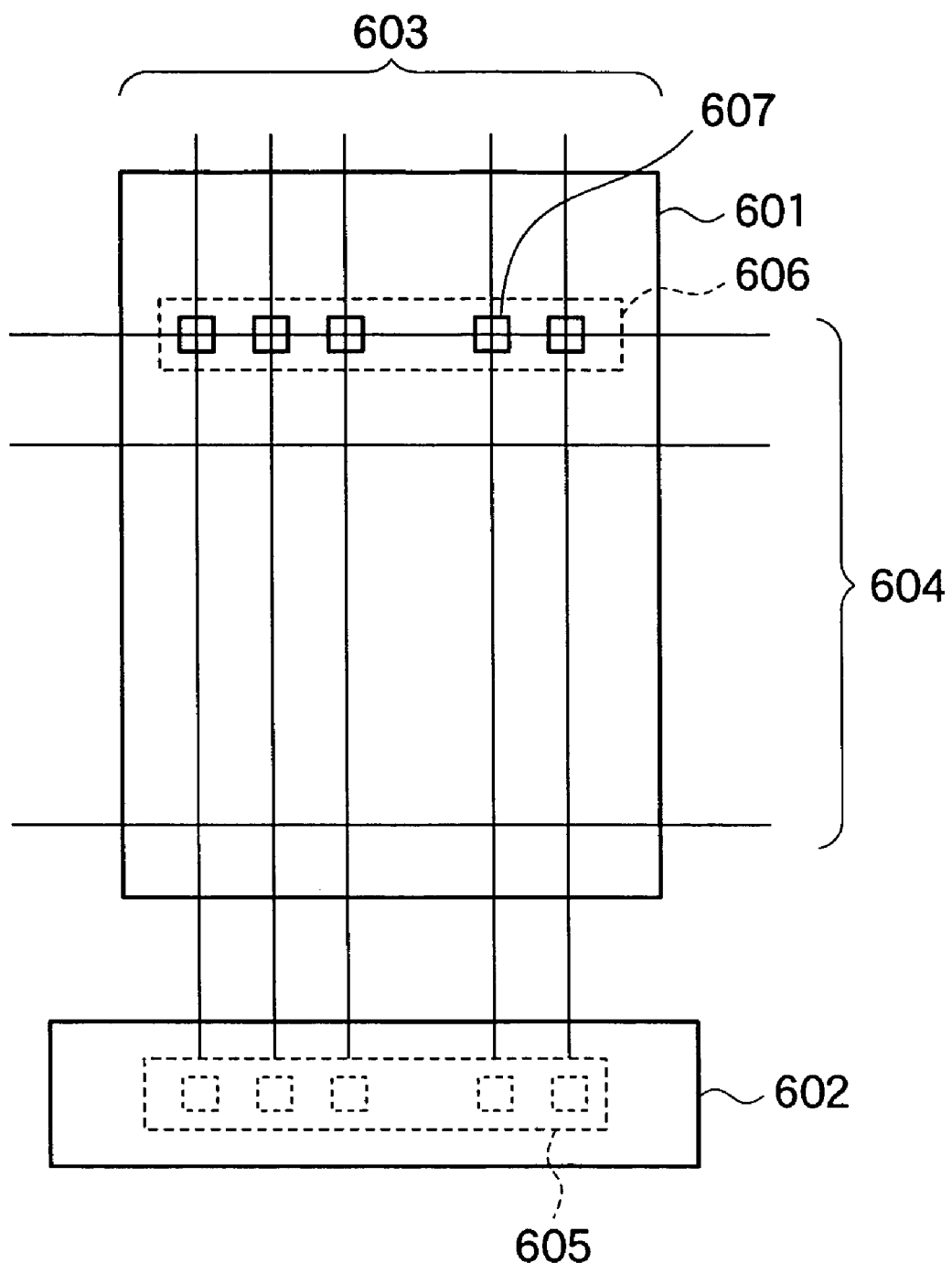
FIG. 36 is a schematic block diagram of page flash memory used in a nonvolatile semiconductor memory according to an eighth embodiment of the present invention.

The page mode performs at once, as shown in FIG. 36, a single read-out operation of a memory cell string 606, which is formed on a word line 604 in a flash memory cell array 601, as a memory cell string 605 to enter a sense amplifier 602 via bit lines 603, or alternatively, a write-in operation from the sense amplifier 602. In other words, read-out/write-in is performed page-by-page. In FIG. 36, memory cells 607 are arranged on the intersections of the word lines 604 and the bit lines 603.

Figure 37:
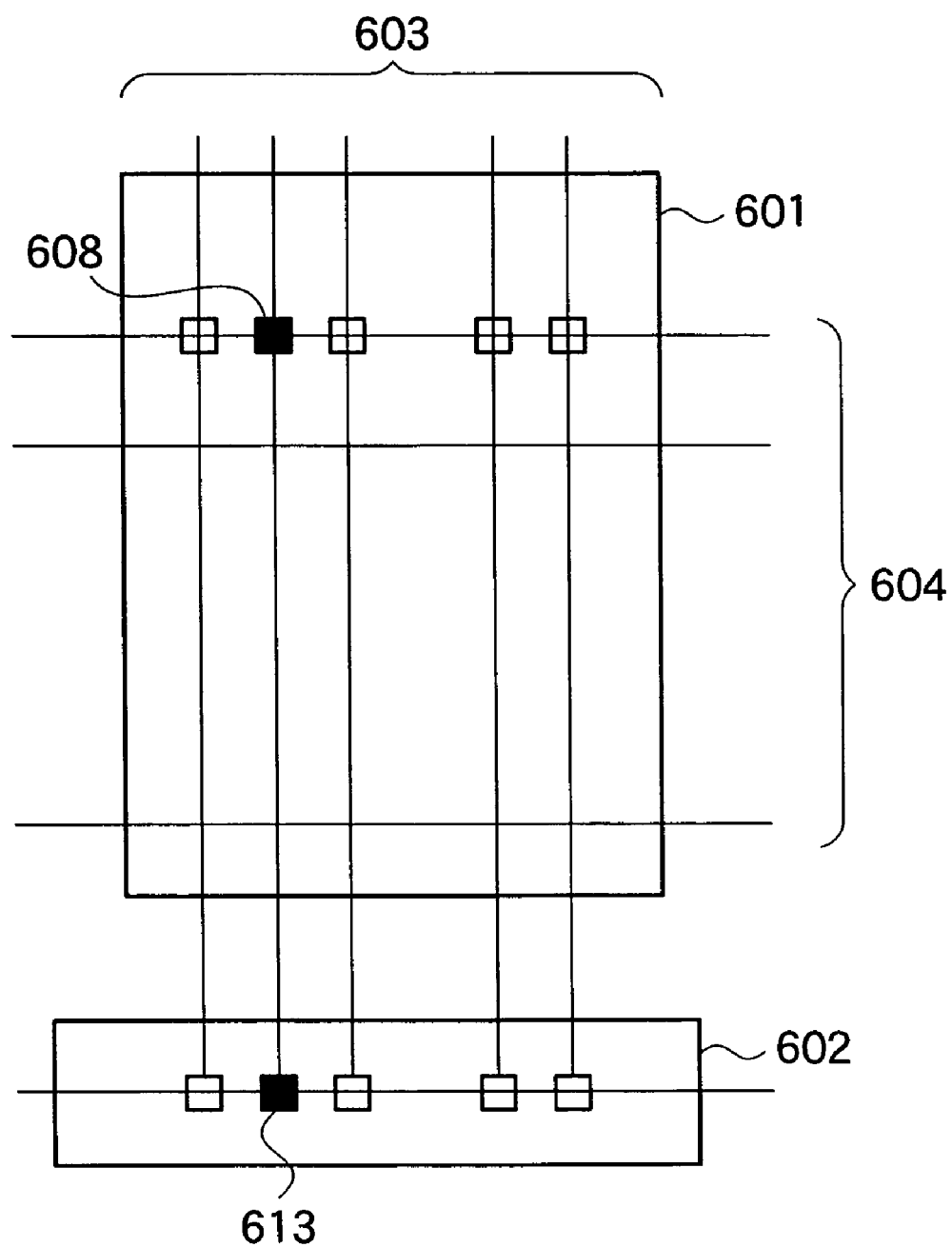
FIG. 37 is a schematic block diagram of byte flash memory used in the nonvolatile semiconductor memory according to the eighth embodiment of the present invention.

In contrast, the byte mode performs, byte-by-byte, as shown in FIG. 37, a read-out operation of a memory cell 608 formed on a word line 604 in the flash memory cell array 601, as a memory cell 613 byte-by-byte to enter the sense amplifier 602, or a write-in operation from the memory cell 613 in the sense amplifier 602 to the memory cell 608 byte-by-byte. In other words, the byte mode is different from the page mode in that read-out/write-in is performed byte-by-byte.

Figure 38:
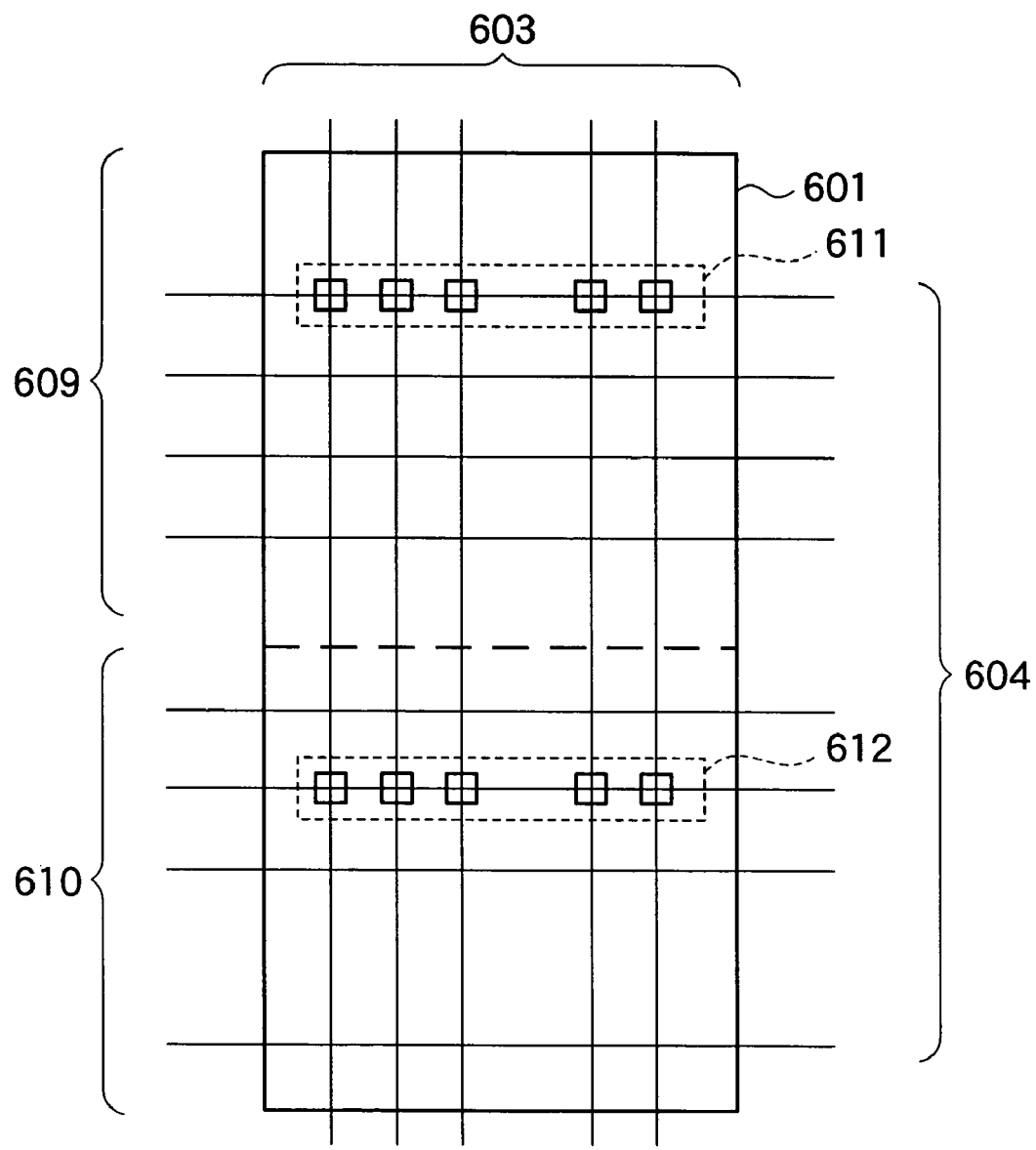
FIG. 38 is a schematic block diagram of ROM region included EEPROM flash memory used in a nonvolatile semiconductor memory system according to the eighth embodiment of the present invention.

The ROM region included EEPROM mode, performs, as shown in FIG. 38, operations of reading out information from the flash memory cell array 601 page-by-page, or, byte-by-byte, and rewriting the information while systematically switching a ROM region included EEPROM 610 section, which is provided by partitioning the inside of the flash memory cell array 601 into the ROM region included EEPROM 610 section and a flash memory 609 section. An example is shown in FIG. 38 where a memory cell string 611 on the same word line in the flash memory 609 is read out or written page-by-page as a substitute for the memory cell string 612 in the ROM included EEPROM 610.

Naturally, it is possible to operate the nonvolatile semiconductor memory according to the first through seventh embodiments of the present invention in each mode: page mode, byte mode, and ROM region included EEPROM mode. In addition, examples of NAND flash memory are described with the above-discussed nonvolatile semiconductor memory according to the first through seventh embodiments of the present invention, however, it is possible to implement write-in methods that are characteristic of the present invention to AND flash memory, and DINOR flash memory as well. Furthermore, it is apparent that operation modes of page mode, byte mode, and ROM region included EEROM mode may be implemented to any of the above three types of flash memory. In particular, as described later, in the case of using the flash memory in applications such as memory cards or IC cards, the ROM region included EEPROM mode allowing the flash memory to operate systematically is important for configuring a system LSI as well as in terms of advancing one-chip integration.

[System LSI]

Various application examples are possible with the nonvolatile semiconductor memory according to the first through seventh embodiments of the present invention. Some of these application examples are shown in FIG. 39 through FIG. 52.

APPLICATION EXAMPLE 1

Figure 39:
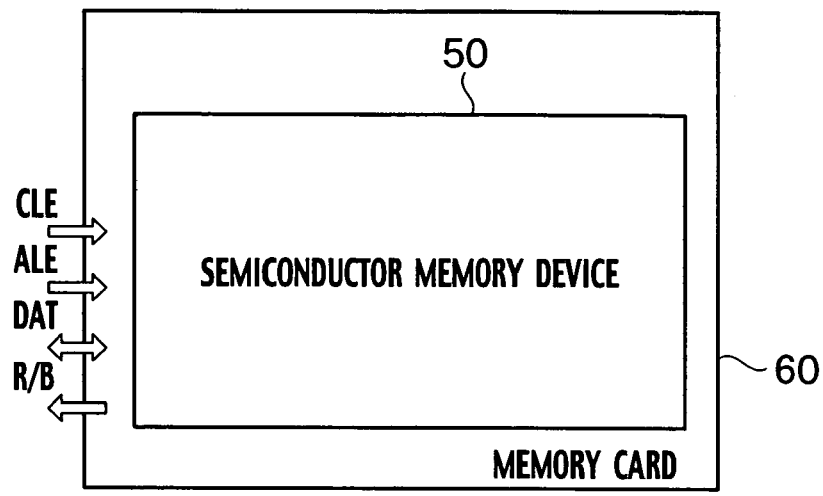
FIG. 39 is a schematic block diagram showing the internal configuration of a memory card to which is applied the nonvolatile semiconductor memory system according to the eighth embodiment of the present invention.

As an example, a memory card 60 including a semiconductor memory device 50 is configured as shown in FIG. 39. The nonvolatile semiconductor memory according to the first through seventh embodiments of the present invention is applicable to the semiconductor memory device 50. The memory card 60, as shown in FIG. 39, is operable so as to receive a predetermined signal from an external device (not shown in the drawing) or to output a predetermined signal from an external device (not shown in the drawing).

A signal line DAT, a command line enable signal line CLE, an address line enable signal line ALE, and a ready/ busy signal line R/B are connected to the memory card 60, which includes the semiconductor memory device 50. The signal line DAT is used to transfer a data signal, address signal, or command signal. The command line enable signal line CLE is used to transmit a signal, which indicates that a command signal is being transferred over the signal line DAT. The address line enable signal line ALE is used to transmit a signal, which indicates that an address signal is being transferred over the signal line DAT. The ready/busy signal line R/B is used to transmit a signal, which indicates whether the semiconductor memory device 50 is ready or not.

APPLICATION EXAMPLE 2

Figure 40:
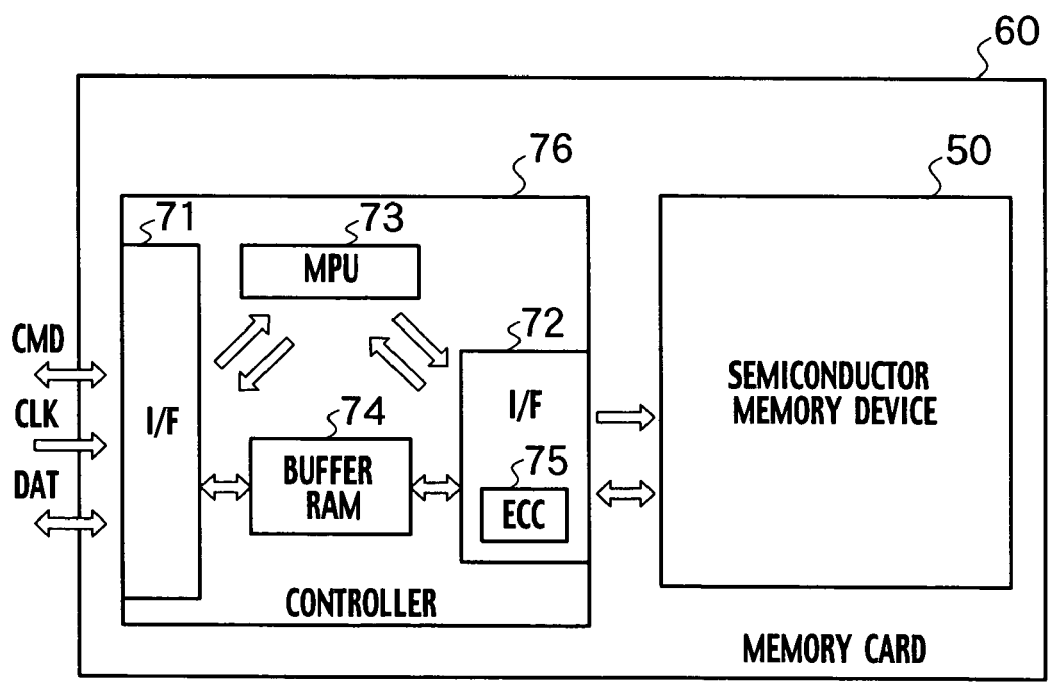
FIG. 40 is a schematic block diagram showing the internal configuration of the memory card to which is applied the nonvolatile semiconductor memory system according to the eighth embodiment of the present invention.

Another example of the memory card 60 includes, as shown in FIG. 40, a semiconductor memory device 50, and a controller 76 that controls the semiconductor memory device 50 and receives/transmits a predetermined signal from/to an external device, unlike with the example of the memory card of FIG. 39. The controller 76 has interface units (I/F) 71 and 72, a microprocessor unit (MPU) 73, buffer RAM 74, and an error correction code unit (ECC) 75 included in the interface unit (I/F) 72.

The interface unit (I/F) 71 receives/transmits a predetermined signal from/to an external device, and the interface unit (I/F) 72 receives/transmits a predetermined signal from/to the semiconductor memory device 50. The microprocessor unit (MPU) 73 converts a logic address into a physical address. The buffer RAM 74 temporarily stores data. The error correction code unit (ECC) 75 generates an error correction code.

A command signal line CMD, a clock signal line CLK, and a signal line DAT are connected to the memory card 60. The number of control signal lines, bit width of the signal line DAT, and circuitry of the controller 76 may be modified if needed.

APPLICATION EXAMPLE 3

Figure 41:
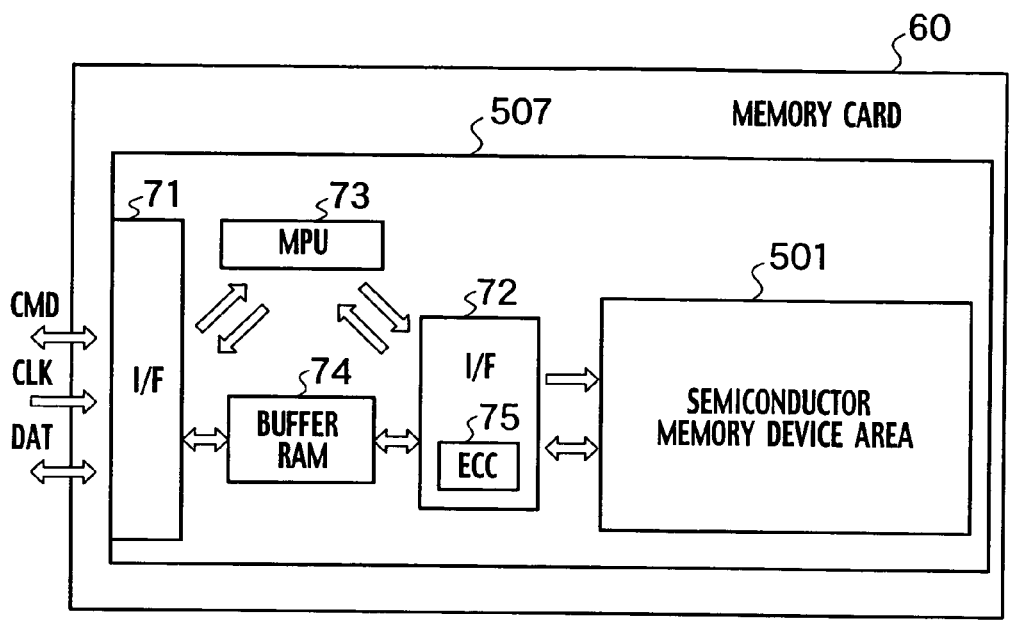
FIG. 41 is a schematic block diagram showing the internal configuration of the memory card to which is applied the nonvolatile semiconductor memory system according to the eighth embodiment of the present invention.

Yet another exemplary structure of the memory card 60 implements, as shown in FIG. 41, a single chip or a system LSI Chip 507 integrating all of the interface units (I/F) 71 and 72, the microprocessor unit (MPU) 73, buffer RAM 74, the error correction code unit (ECC) 75 included in the interface unit (I/F) 72, and a semiconductor memory device region 501. Such system LSI chip 507 is mounted in the memory card 60.

APPLICATION EXAMPLE 4

Figure 42:
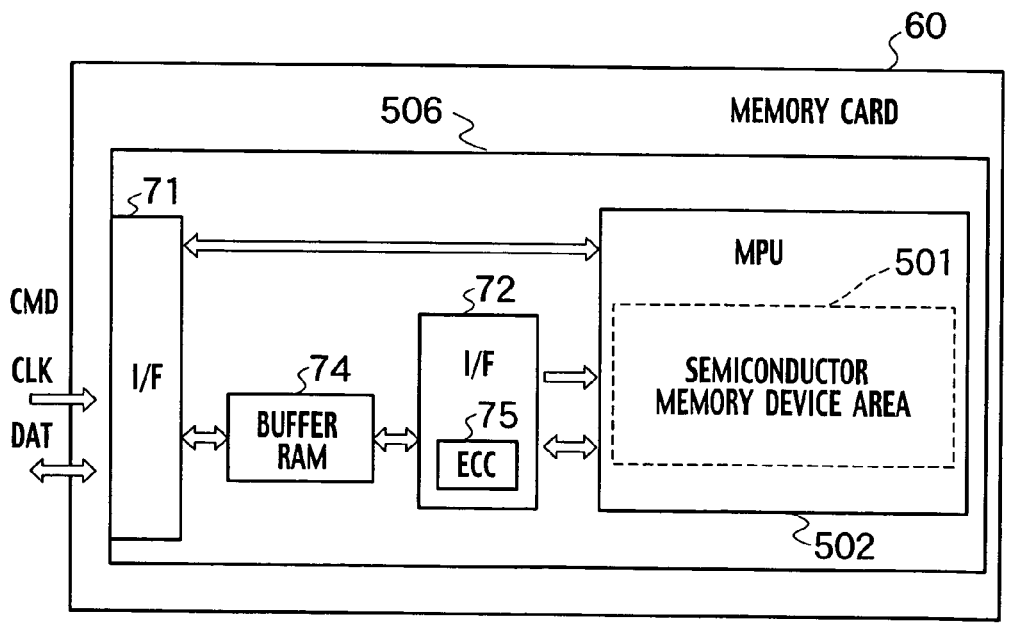
FIG. 42 is a schematic block diagram showing the internal configuration of the memory card to which is applied the nonvolatile semiconductor memory system according to the eighth embodiment of the present invention.

Yet another exemplary structure of the memory card 60 implements, as shown in FIG. 42, a mixed memory MPU 502 by forming the semiconductor memory device region 501 in the microprocessor unit (MPU) 73, and implements a single chip or a system LSI chip 506 integrating all of the interface units (I/F) 71 and 72, buffer RAM 74, and the error correction code unit (ECC) 75 included in the interface unit (I/F) 72. Such system LSI chip 506 is mounted in the memory card 60.

APPLICATION EXAMPLE 5

Figure 43:
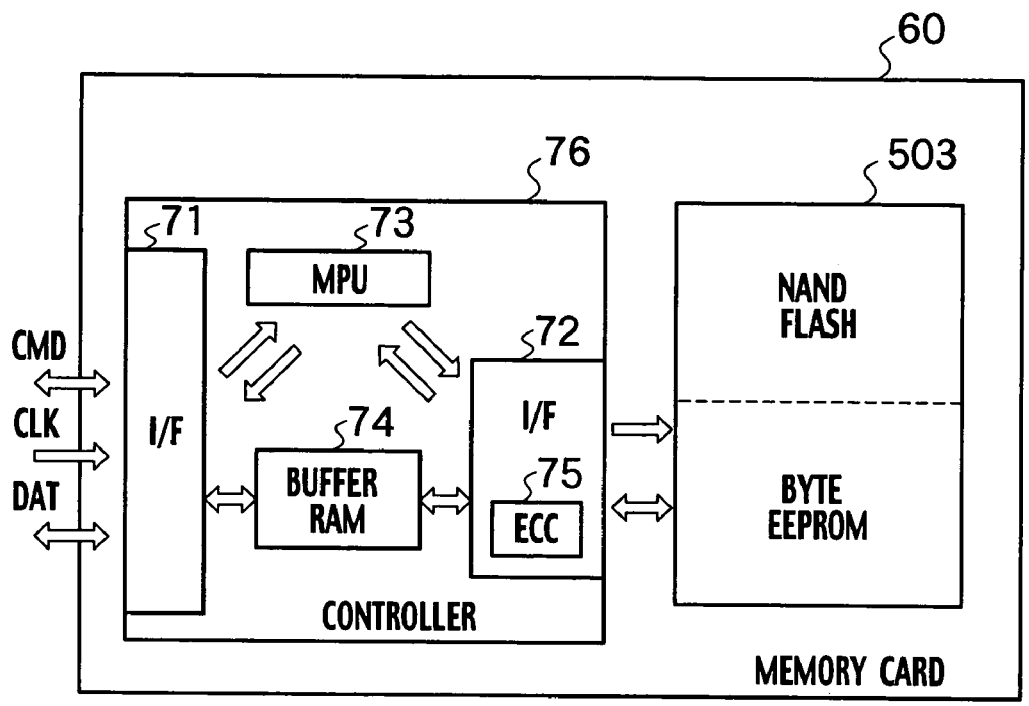
FIG. 43 is a schematic block diagram showing the internal configuration of the memory card to which is applied the nonvolatile semiconductor memory system according to the eighth embodiment of the present invention.

Yet another exemplary structure of the memory card 60 utilizes, as shown in FIG. 43, a ROM region included EEPROM mode flash memory 503, which is configured with byte EEPROM and NAND flash memory, instead of the semiconductor memory 50 shown in FIG. 39 or FIG. 40.

Naturally, it is possible to configure the system LSI chip 507 by forming the ROM region included EEPROM mode flash memory 503 in the same chip as the controller 76, as shown in FIG. 41, and integrating the memory 503 and controller 76 on a single chip. In addition, as shown in FIG. 42, naturally, it is possible to implement a mixed memory MPU 502 by forming a semiconductor memory region configured with the ROM region included EEPROM mode flash memory 503 in the microprocessor unit (MPU) 73, and to configure the system LSI chip 506 by integrating the interface units (I/F) 71 and 72 and buffer RAM 74 all onto a single chip.

APPLICATION EXAMPLE 6

Figure 44:
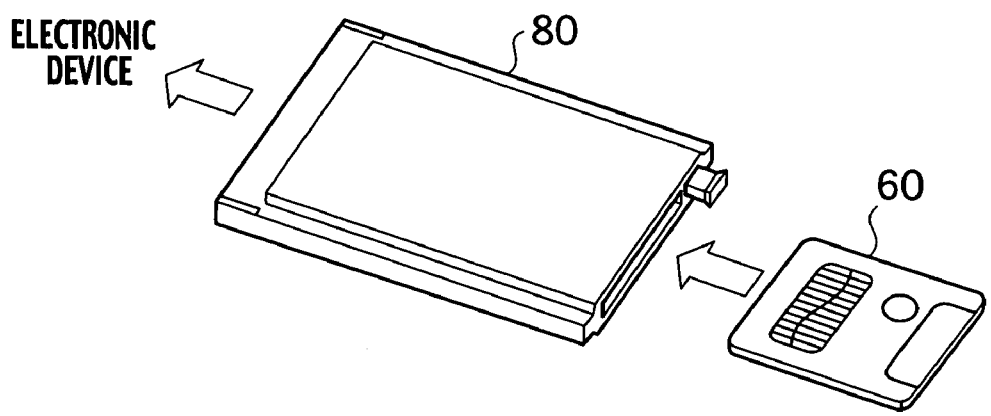
FIG. 44 is a schematic block diagram of a memory card and a card holder to which is applied the nonvolatile semiconductor memory system according to the eighth embodiment of the present invention.

As an application example of the memory card 60 shown in FIG. 40 through FIG. 43, a memory card holder 80 may be utilized, as shown in FIG. 44. The memory card holder 80 may receive the memory card 60, which uses the nonvolatile semiconductor memory described in detail in the first through seventh embodiments of the present invention as a semiconductor memory 50. The memory card holder 80 is connected to an electronic device (not shown in the drawing), and is operable as an interface between the memory card 60 and the electronic device. The memory card holder 80 is capable of executing various functions including functions of the controller 76, the microprocessor unit (MPU) 73, buffer RAM 74, the error correction code unit (ECC) 75, and the interface units (I/F) 71 and 72 in the memory card 60 disclosed in FIG. 40 through FIG. 43.

APPLICATION EXAMPLE 7

Figure 45:
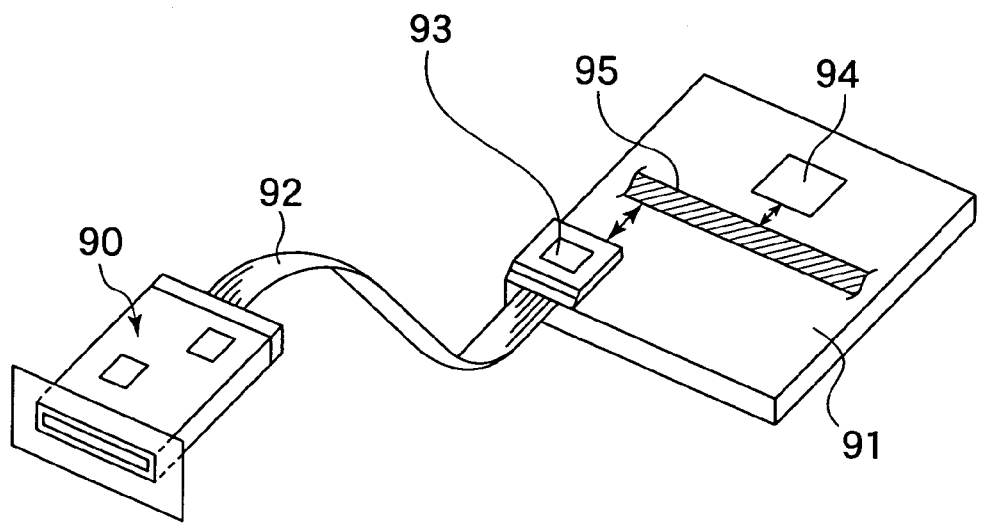
FIG. 45 is a schematic block diagram of a connecting device operable to receive the memory card and card holder to which is applied the nonvolatile semiconductor memory system according to the eighth embodiment of the present invention.

Yet another application example is described while referencing FIG. 45. In FIG. 45, a connecting apparatus 90 capable of receiving the memory card 60 or memory card holder 80 is disclosed. The nonvolatile semiconductor memory described in detail in the first through seventh embodiments of the present invention is embedded in either the memory card 60 or memory card holder 80 and is used as the semiconductor memory 50 or the semiconductor memory device region 501, the mixed memory MPU 502, and ROM region included EEPROM mode flash memory 503. The memory card 60 or memory card holder 80 is attached and electrically connected to the connecting apparatus 90. The connecting apparatus 90 is connected to a circuit board 91, which mounts a CPU 94 and a bus 94 via a connecting wire 92 and an interface circuit 93.

APPLICATION EXAMPLE 8

Figure 46:
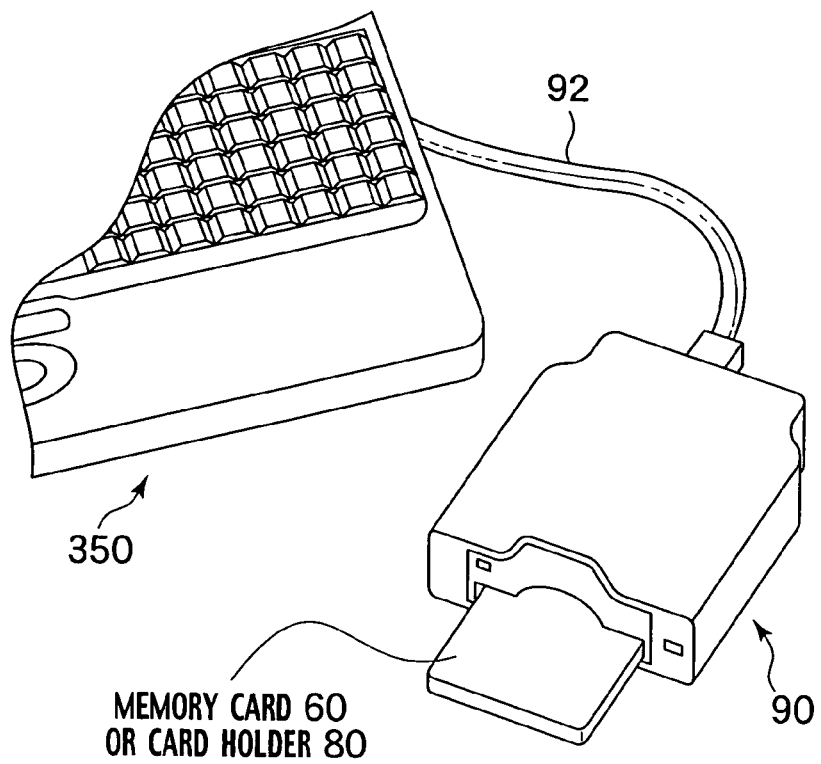
FIG. 46 is a schematic diagram of a coupling device that accommodates an internal memory card to which is applied the nonvolatile semiconductor memory system according to the eighth embodiment of the present invention and connects to a personal computer via a connecting wire.

Another application example is described while referencing FIG. 46. The nonvolatile semiconductor memory described in detail in the first through seventh embodiments of the present invention is embedded in either the memory card 60 or memory card holder 80 and is used as the semiconductor memory 50, the semiconductor memory device region 501, the mixed memory MPU 502, or ROM region included EEPROM mode flash memory 503. The memory card 60 or memory card holder 80 is attached and electrically connected to the connecting apparatus 90. The connecting apparatus 90 is connected to a personal computer (PC) 350 via a connecting wire 92.

APPLICATION EXAMPLE 9

Figure 47:
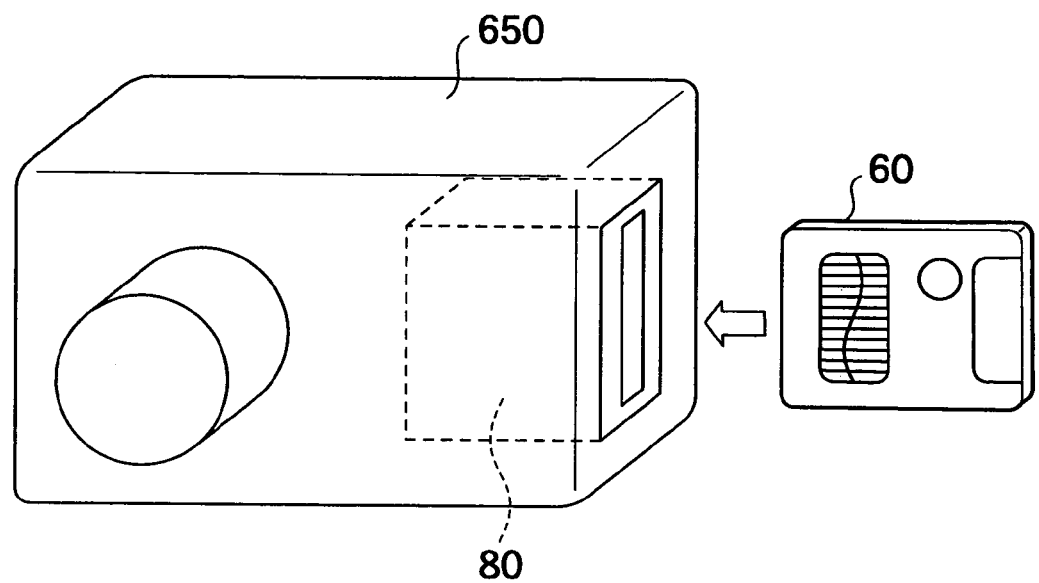
FIG. 47 is a digital camera system capable of accommodating a memory card to which is applied the nonvolatile semiconductor memory system according to the eighth embodiment of the present invention.

Another application example is described while referencing FIG. 47. The memory card 60 includes the nonvolatile semiconductor memory described in detail in the first through seventh embodiments of the present invention, which is used as the semiconductor memory 50, the semiconductor memory device region 501, the mixed memory MPU 502, and ROM region included EEPROM mode flash memory 503. FIG. 47 shows an example of applying such memory card 60 to a digital camera 650 embedded with the memory card holder 80.

APPLICATION EXAMPLE 10

Figure 48:
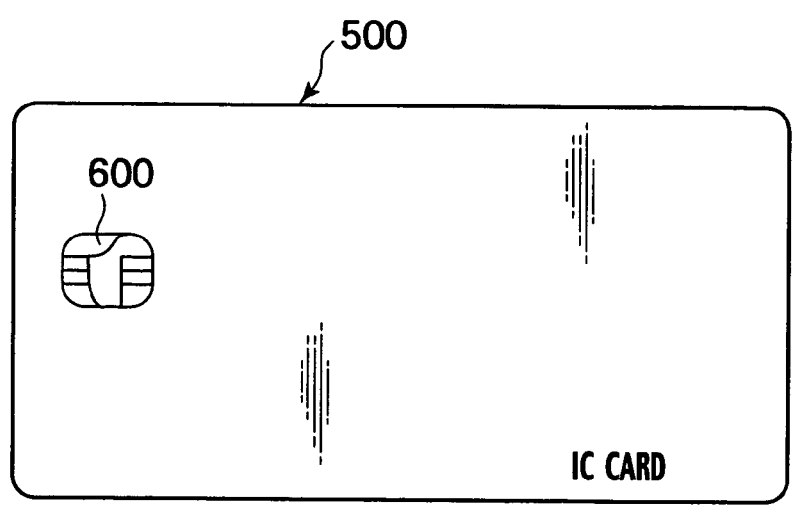
FIG. 48 is a schematic block diagram of an IC card to which is applied the nonvolatile semiconductor memory system according to the eighth embodiment of the present invention.
Figure 49:
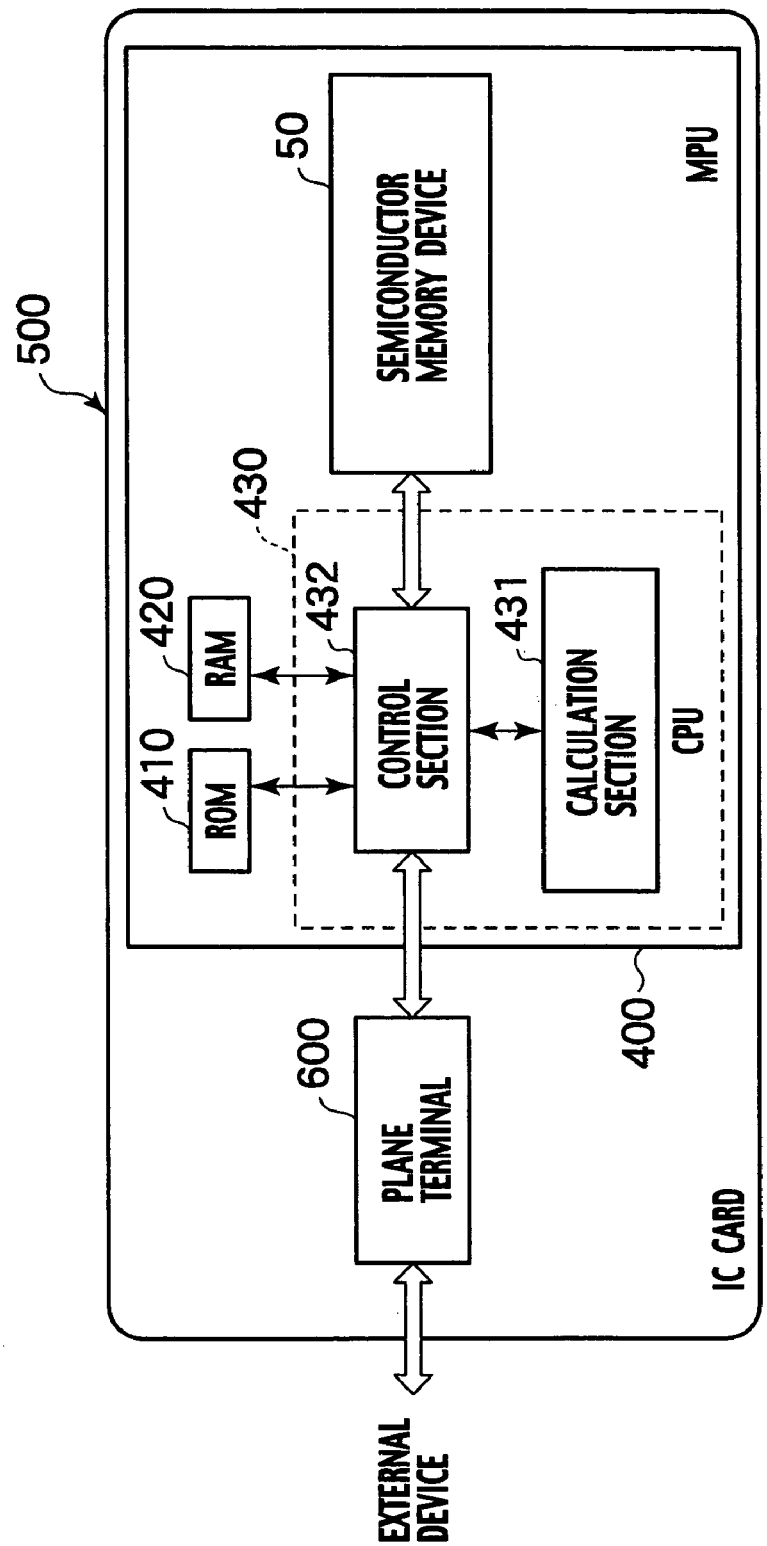
FIG. 49 is a schematic block diagram illustrating the internal configuration of the IC card to which is applied the nonvolatile semiconductor memory system according to the eighth embodiment of the present invention.

Another application example of the nonvolatile semiconductor memory according to the first through seventh embodiments of the present invention configures, as shown in FIG. 48 and FIG. 49, an interface circuit (IC) card 500, which includes an MPU 400 configured with a semiconductor memory 50, ROM 410, RAM 420 and a CPU 430, and a plane terminal 600. The IC card 500 can be connected to an external device via the plane terminal 600. Furthermore, the plane terminal 600 is coupled to the MPU 400 in the IC card 500. The CPU 430 includes a calculation section 431 and a control section 432. The control section 432 is coupled to the semiconductor memory 50, ROM 410, and RAM 420. It is desirable that the MPU 400 be molded on one of the surfaces of the IC card 500, and the plane terminal 600 be formed on the other surface of the IC card 500. As shown in FIG. 49, the nonvolatile semiconductor memory described in detail in the first through seventh embodiments of the present invention is applicable to the semiconductor memory 50 or ROM 410. In addition, it is possible for the nonvolatile semiconductor memory to operate in page mode, byte mode, or ROM region included EEPROM mode.

APPLICATION EXAMPLE 11

Figure 50:
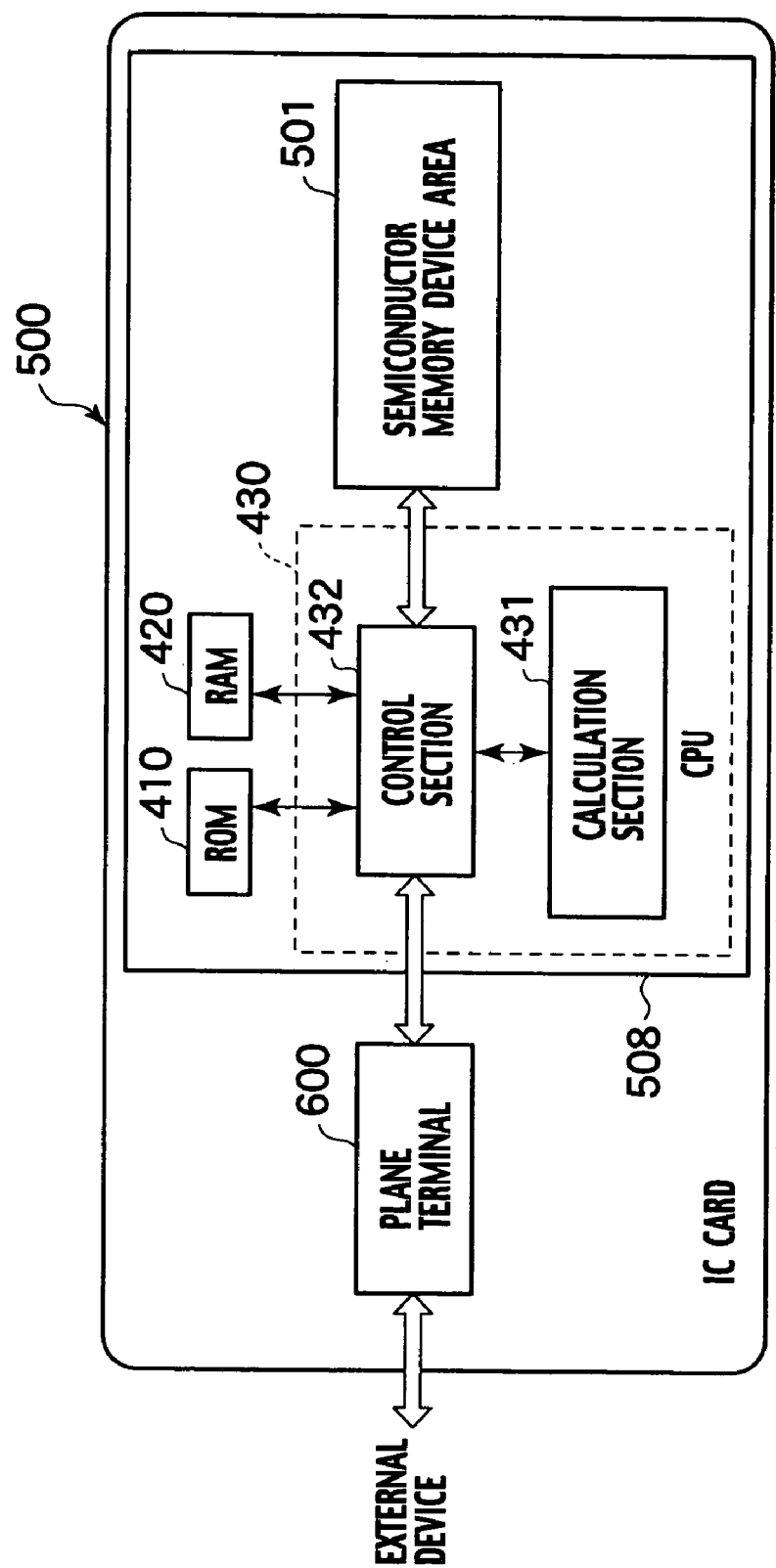
FIG. 50 is a schematic block diagram illustrating the internal configuration of the IC card to which is applied the nonvolatile semiconductor memory system according to the eighth embodiment of the present invention.

Yet another exemplary structure of the IC card 500 configures, as shown in FIG. 50, a single chip or a system LSI chip 508 integrating all of ROM 410, RAM 420, a CPU 430, and the semiconductor memory device region 501. Such system LSI chip 508 is embedded in the IC card 500. As shown in FIG. 50, the nonvolatile semiconductor memory described in detail in the first through seventh embodiments of the present invention is applicable to the semiconductor memory device region 501 or ROM 410. In addition, it is possible for the nonvolatile semiconductor memory to operate in page mode, byte mode, or ROM region included EEPROM mode.

APPLICATION EXAMPLE 12

Figure 51:
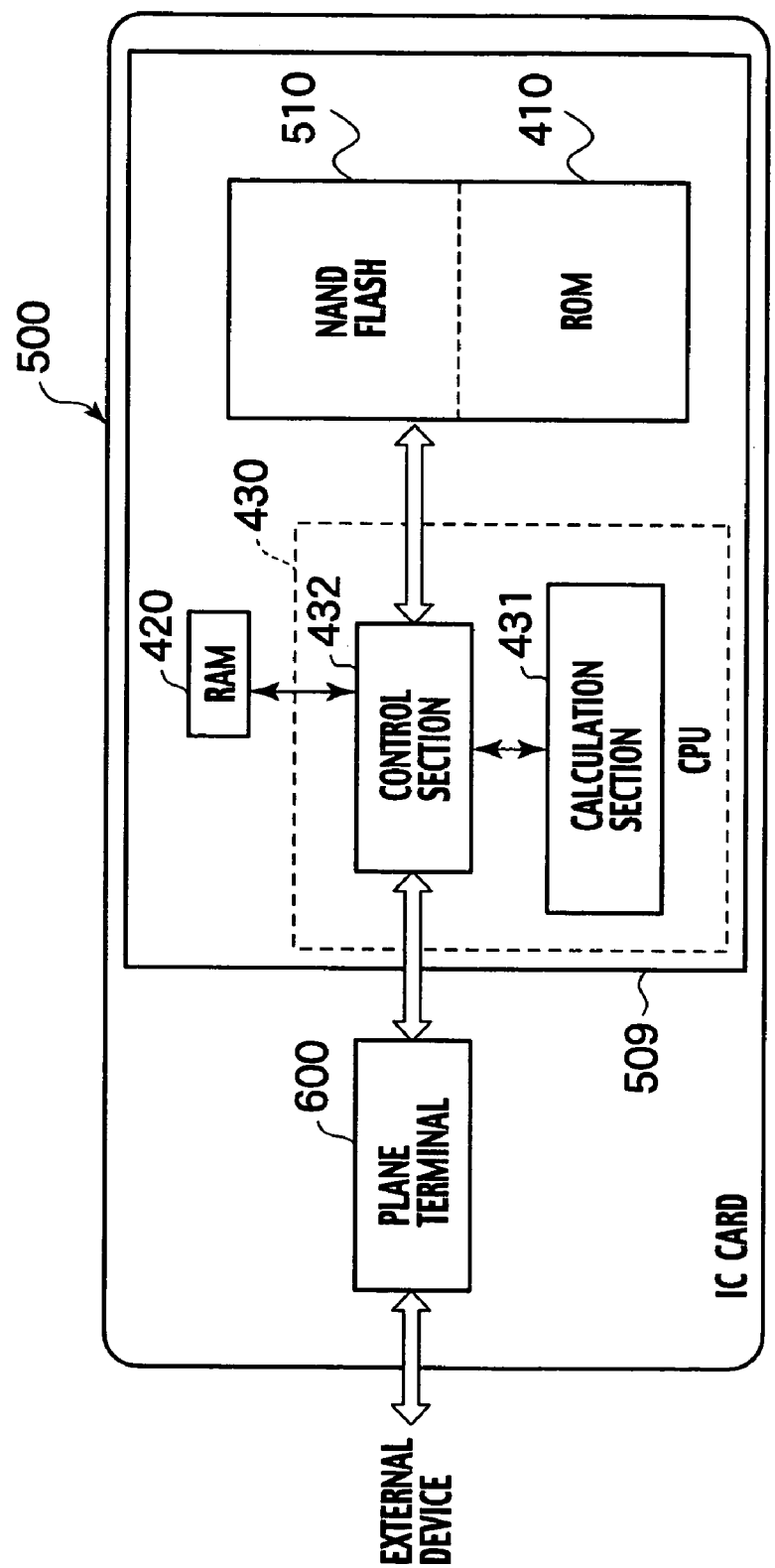
FIG. 51 is a schematic block diagram illustrating the internal configuration of the IC card to which is applied the nonvolatile semiconductor memory system according to the eighth embodiment of the present invention.

Yet another exemplary structure of the IC card 500, as shown in FIG. 51, has the structure of ROM region included EEPROM mode flash memory 510 with an embedded ROM 410 in the semiconductor memory device region 501, and configures a single chip or a system LSI chip 509 integrating all of ROM region included EEPROM mode flash memory 510, RAM 420, and the CPU 430. Such system LSI chip 509 is embedded in the IC card 500.

APPLICATION EXAMPLE 13

Figure 52:
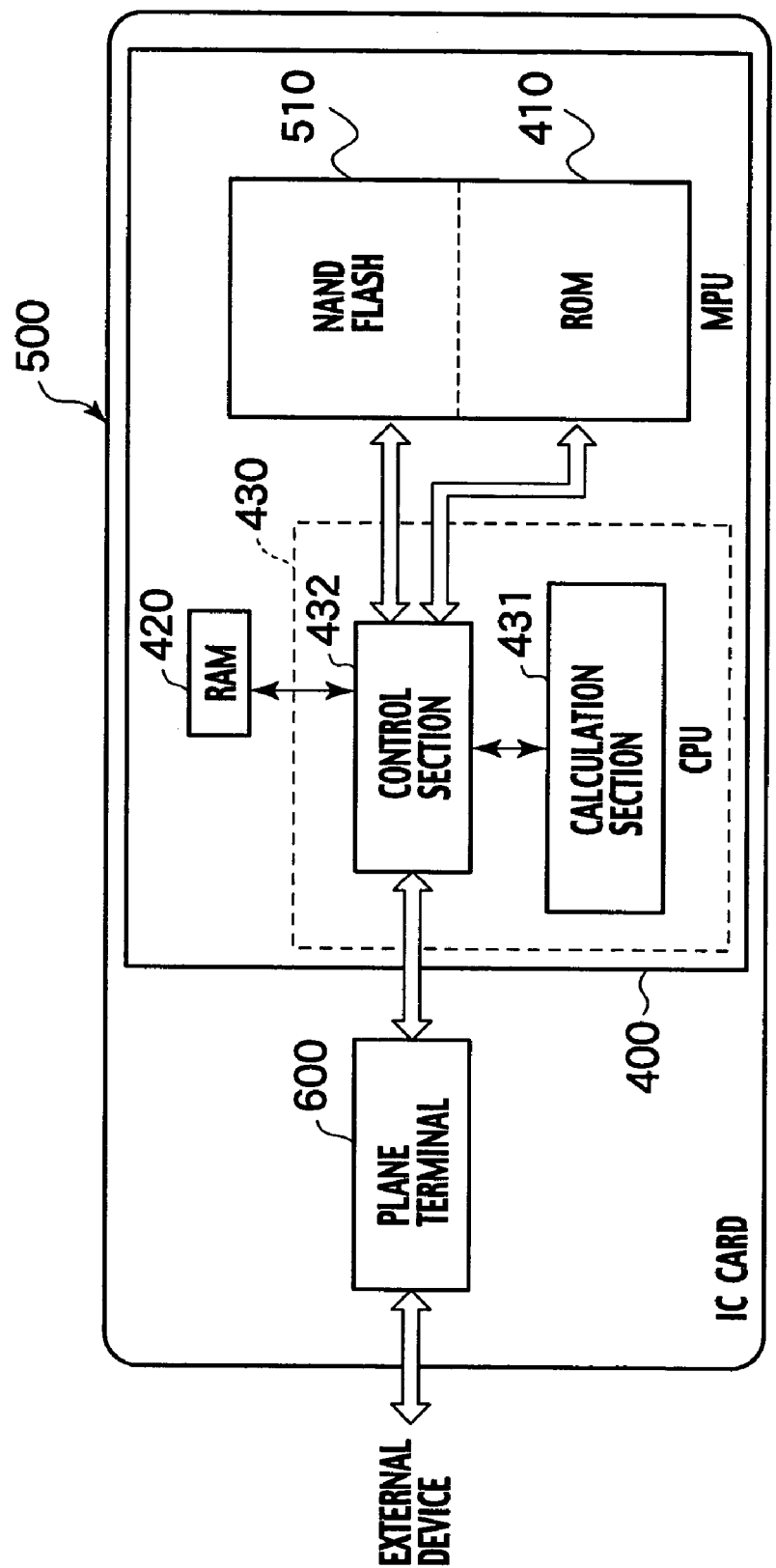
FIG. 52 is a schematic block diagram illustrating the internal configuration of the IC card to which is applied the nonvolatile semiconductor memory system according to the eighth embodiment of the present invention.

Yet another exemplary structure of the IC card 500, as shown in FIG. 52, has the structure of ROM region included EEPROM mode flash memory 510 with an embedded ROM 410 in the semiconductor memory 50 shown in FIG. 49. Such ROM region included EEPROM mode flash memory 510 is embedded in the MPU 400 is the same as with FIG. 49.

With the nonvolatile semiconductor memory of the present invention as described above, by applying a dummy pulse to the control gate lines before applying the pulses of an intermediate voltage Vpass and a write-in voltage Vpgm, the number of electrons in the NAND cell unit is reduced and the channel voltage is increased, thereby improving the erroneous write-in characteristics. The nonvolatile semiconductor memory of the present invention is extremely versatile and can be used in combination with various channel voltage boosting methods such as the SB method, LSB method and EASB method. Even with the bit line side select gate line SGD voltage boosting method, which transfers a bit line voltage which does not go below the value of the threshold voltage by temporarily boosting the voltage of the bit line side select gate line SGD, using the write-in method of the present invention, favorable erroneous write-in characteristics may be achieved since excessive electrons are again discharged from within the NAND cell unit.

(Other Embodiments)

As described above, the present invention is described according to embodiments, however, it should not be perceived that descriptions forming a part of this disclosure and drawings are intended to limit the present invention. Various alternative embodiments, working examples, and operational techniques will become apparent from this disclosure for those skilled in the art. Accordingly, the technical range of the present invention is determined only by specified features of the invention, according to the above-mentioned descriptions and appropriate appended claims.

In addition, the embodiments of the present invention can be modified and implemented in various ways as long as not deviating from the present invention. It should be noted that each of the above embodiments can be implemented in respective combinations. In this manner, the present invention naturally includes various embodiments not described herein.

What is claimed is:

1. A nonvolatile semiconductor memory having a plurality of common control gate lines, a plurality of bit lines and a source line comprising:
    a memory cell array including a memory cell block comprising a plurality of memory cell units arranged in parallel with each other in a row direction, each of the memory cell unit comprising:
        a plurality of memory cell transistors arranged in a column line;
        a first select gate transistor connected to the bit line at a first end of each of the memory cell transistors; and
        a second select gate transistor connected to the source line at a second end of each of the memory cell transistors so that the memory cell transistors arranged in a row can be connected to the common control gate line; and
    a control gate line drive circuit configured to simultaneously write-in all of the memory cell transistors connected to a selected control gate line,
    wherein different types of voltages incapable of write-in applied at least once to all or a part of the control gate lines before applying a high plus voltage for write-in to the selected control gate line.

2. The nonvolatile semiconductor memory of claim 1, wherein a predetermined low channel voltage is applied for a selected memory cell transistor in a selected memory cell unit to perform write-in by the control gate line drive circuit, when a high plus voltage is applied to the selected control gate line; and a voltage self-boosted from the channel voltage is applied for an unselected memory transistor to restrict write-in by the control gate line drive circuit, the unselected memory transistor is connected to the selected control gate line, through capacitive coupling to one to a plurality of control gate lines.

3. The nonvolatile semiconductor memory of claim 2, wherein a reference voltage is applied to the control gate line to which the different types of voltages have been applied, once the different types of voltages incapable for write-in are applied.

4. The nonvolatile semiconductor memory of claim 3, wherein, when sequentially writing to all control gate lines in the selected memory cell block, write-in is performed by selecting in order from a first control gate line from the source line side towards the bit line side.

5. The nonvolatile semiconductor memory of claim 4, wherein the voltage incapable for write-in is a single type of voltage.

6. The nonvolatile semiconductor memory of claim 5, wherein a time necessary for applying the voltage incapable for write-in varies depending on the control gate line.

7. The nonvolatile semiconductor memory of claim 6, wherein the time necessary for applying the voltage incapable for write-in to an unselected control gate line is shorter than time necessary for applying the voltage incapable for write-in to the selected control gate line.

8. The nonvolatile semiconductor memory of claim 6, wherein the time necessary for applying the voltage incapable for write-in to an unselected control gate line that is arranged on the bit line side is shorter than time necessary for applying the voltage incapable for write-in to the selected control gate line and an unselected control gate line that is arranged further along the source line side than the selected control gate line.

9. A nonvolatile semiconductor memory having a plurality of common control gate lines, a plurality of bit lines and a source line comprising:
  a memory cell array including a memory cell block comprising a plurality of memory cell units arranged in parallel with each other in a row direction, each of the memory cell unit comprising:
    a plurality of memory cell transistors arranged in a column line;
    a first select gate transistor connected to the bit line at a first end of each of the memory cell transistors; and
    a second select gate transistor connected to the source line at a second end of each of the memory cell transistors so that the memory cell transistors arranged in a row can be connected to the common control gate line; and
  a control gate line drive circuit configured to simultaneously write-in all of the memory cell transistors connected to a selected control gate line,
  wherein, before applying a plus first voltage intended for write-in to the selected control gate line, and applying a second voltage intended for boosting a channel voltage to at least a part or all of unselected control gate lines, a third voltage incapable for write-in is applied at least once to all or a part of the control gate lines.

10. The nonvolatile semiconductor memory of claim 9, wherein,
  a predetermined low channel voltage is applied for a selected memory cell transistor in a selected memory cell unit to perform write-in by the control gate line drive circuit, when a high plus voltage is applied to the selected control gate line; and
  a voltage self-boosted from the channel voltage is applied for an unselected memory transistor to restrict write-in by the control gate line drive circuit, the unselected memory transistor is connected to the selected control gate line, through capacitive coupling to one to a plurality of control gate lines.

11. The nonvolatile semiconductor memory of claim 10, wherein,
  a reference voltage is applied to the control gate line to which the third voltage has been applied, once the third voltage is applied.

12. The nonvolatile semiconductor memory of claim 11, wherein, when sequentially writing to all control gate lines in the selected memory cell block, write-in is performed while selecting in order from a first control gate line from the source line side towards the bit line side.

13. The nonvolatile semiconductor memory of claim 12, wherein a time necessary for applying the third voltage varies depending on the control gate line.

14. The nonvolatile semiconductor memory of claim 13, wherein the time necessary for applying the third voltage to an unselected control gate line is shorter than time necessary for applying the third voltage to the selected control gate line.

15. The nonvolatile semiconductor memory of claim 13, wherein the time necessary for applying the third voltage to an unselected control gate line, which is arranged on the bit line side, is shorter than time necessary for applying the third voltage to the selected control gate line and an unselected control gate line, which is arranged further on the source line side than the selected control gate line.

16. A nonvolatile semiconductor memory having a plurality of common control gate lines, a plurality of bit lines and a source line comprising:
  a memory cell array including a memory cell block comprising a plurality of memory cell units arranged in parallel with each other in a row direction, each of the memory cell unit comprising:
    a plurality of memory cell transistors arranged in a column line;
    a first select gate transistor connected to the bit line at a first end of each of the memory cell transistors;
    a second select gate transistor connected to the source line at a second end of each of the memory cell transistors so that the memory cell transistors arranged in a row can be connected to the common control gate line; and
    a select gate line connected to gates of the first select gate transistors arranged in the same row; and
  a control gate line drive circuit configured to simultaneously write-in all of the memory cell transistors connected to a selected control gate line,
  wherein a first voltage for transferring a bit line voltage which does not go below a value of a threshold voltage is applied to the select gate line of the first select gate transistor; a second voltage smaller than the first voltage is applied to the select gate line of the first select gate transistor; different types of voltages incapable for write-in is applied at least once to at least a part or all of the control gate lines; and a high plus voltage is applied for write-in to the selected control gate line, once the first voltage is applied, the second voltage, and the different types of voltages are applied before applying the high plus voltage.

17. The nonvolatile semiconductor memory of claim 16, wherein a predetermined low channel voltage applied for a selected memory cell transistor in a selected memory cell unit to perform write-in by the control gate line drive circuit, when a high plus voltage is applied to the selected control gate line; and a voltage self-boosted from the channel voltage for an unselected memory transistor to restrict write-in by the control gate line drive circuit, the unselected memory transistor is connected to the selected control gate line, through capacitive coupling to one to a plurality of control gate lines.

18. The nonvolatile semiconductor memory of claim 17, wherein a reference voltage applied to the control gate line to which the different types of voltages have been applied, once the different types of voltages incapable for write-in are applied.

19. The nonvolatile semiconductor memory of claim 18, wherein, when sequentially writing to all control gate lines in the selected memory cell block, write-in is performed by selecting in order from a first control gate line from the source line side towards the bit line side.

20. The nonvolatile semiconductor memory of claim 19, wherein a single type of voltage incapable for write-in is provided.

21. The nonvolatile semiconductor memory of claim 20, wherein a time necessary for applying the voltage incapable for write-in varies depending on the control gate line.

22. The nonvolatile semiconductor memory of claim 21, wherein the time necessary for applying the voltage incapable for write-in to an unselected control gate line is shorter than time necessary for applying the voltage incapable for write-in to the selected control gate line.

23. The nonvolatile semiconductor memory of claim 21, wherein the time necessary for applying the voltage incapable for write-in to an unselected control gate line, which is arranged on the bit line side, is shorter than time necessary for applying the voltage incapable for write-in to the selected control gate line and an unselected control gate line, which is arranged further along the source line side than the selected control gate line.

\* \* \* \* \*